(12) United States Patent
Maffeis

(10) Patent No.: US 9,715,430 B2
(45) Date of Patent: *Jul. 25, 2017

(54) CONTROLLER FOR A SOLID-STATE DRIVE, AND RELATED SOLID-STATE DRIVE

(71) Applicant: NandEXT S.r.l., Località Dogana (SM)

(72) Inventor: Margherita Maffeis, Dalmine (IT)

(73) Assignee: NandEXT Srl (SM)

( * ) Notice: Subject to any disclaimer, the term of this patent is extended or adjusted under 35 U.S.C. 154(b) by 49 days.

This patent is subject to a terminal disclaimer.

(21) Appl. No.: 14/789,513

(22) Filed: Jul. 1, 2015

(65) Prior Publication Data

US 2017/0004039 A1 Jan. 5, 2017

(51) Int. Cl.
*H03M 13/00* (2006.01)
*G06F 11/10* (2006.01)
(Continued)

(52) U.S. Cl.
CPC .......... *G06F 11/1072* (2013.01); *G06F 3/064* (2013.01); *G06F 3/0619* (2013.01);
(Continued)

(58) Field of Classification Search
CPC ............................ G11C 16/0475; G11C 16/28
See application file for complete search history.

(56) References Cited

U.S. PATENT DOCUMENTS 4,996,669 A * 2/1991 Endoh ................ G11C 16/0483
365/185.02

8,327,246 B2 * 12/2012 Weingarten ......... G06F 11/1072
714/790

(Continued)

*Primary Examiner* — Guy Lamarre
(74) *Attorney, Agent, or Firm* — Janeway Patent Law PLLC

(57) ABSTRACT

A controller for a solid state drive is proposed. The solid state drive comprises a plurality of memory cells, wherein each memory cell comprises a floating gate transistor for storing a symbol when programmed with a threshold voltage associated with that symbol, and wherein each threshold voltage is variable over the memory cells of the plurality of memory cells thereby defining a corresponding threshold voltage distribution. The controller comprises:

Figure 1A:
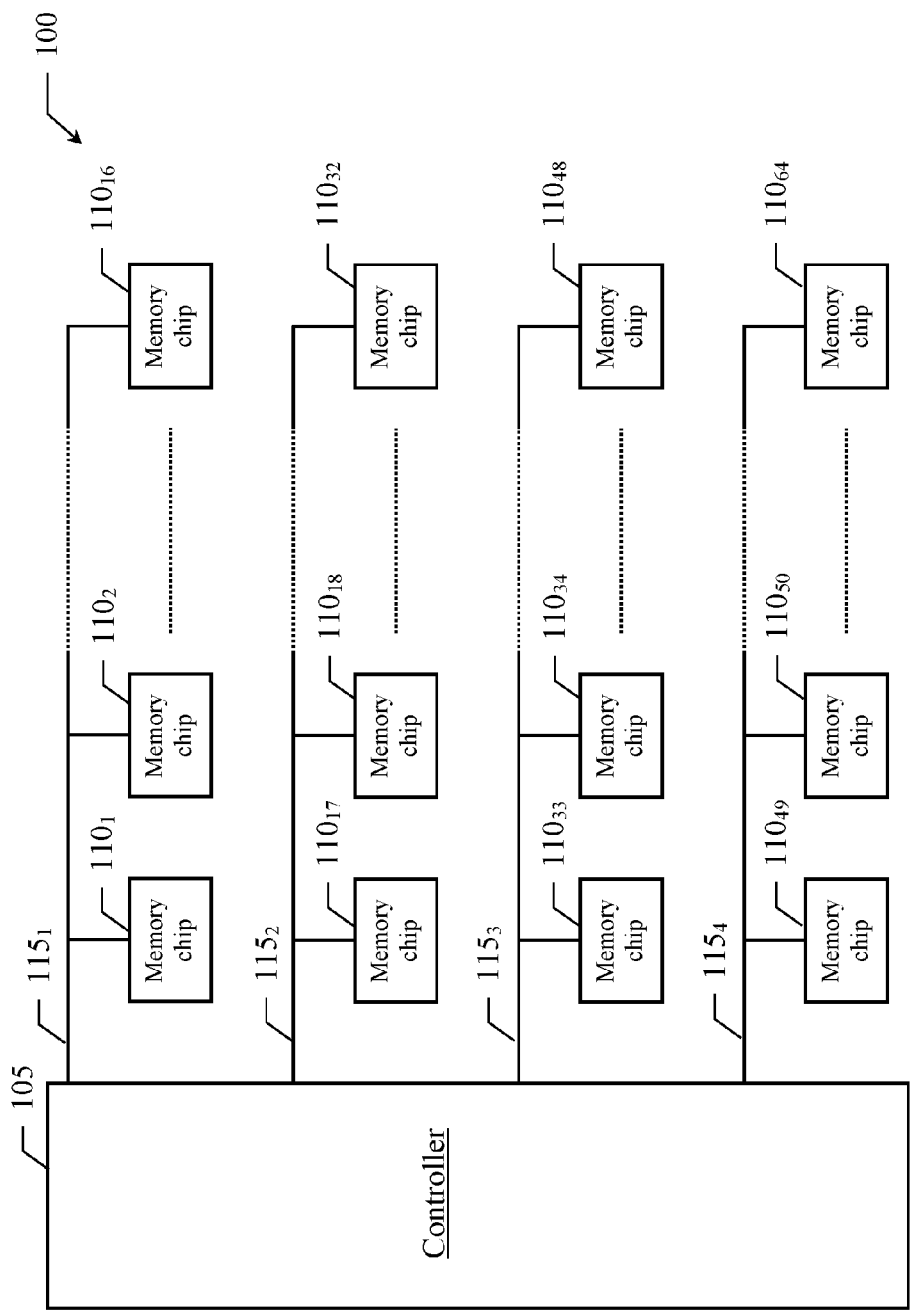

an encoding unit for encoding information bits into encoded bits;
a mapping unit for mapping the encoded bits into symbols to be stored, each one for being stored into a respective target memory cell, wherein the mapping comprises associating the symbols to be stored with the target memory cells in such a way that the threshold voltage distributions associated with said symbols to be stored define overlapping regions smaller than a predetermined overlapping region indicative of an admitted bit error rate;
a demapping unit for demapping read symbols read from the target memory cells and providing metrics indicative of a distance between the threshold voltage distributions associated with the read symbols;
a conversion unit for converting the metrics into an indication of the reliability of the read symbols; and
a soft decoding unit for soft decoding the read symbols according to the indication of the reliability of the read symbols thereby obtaining the information bits.

A corresponding solid state drive is also proposed.

30 Claims, 11 Drawing Sheets

(51) Int. Cl.
*G11C 16/04* (2006.01)
*G06F 3/06* (2006.01)
*G11C 29/52* (2006.01)
*G11C 29/04* (2006.01)

(52) U.S. Cl.
CPC .......... *G06F 3/0653* (2013.01); *G06F 3/0679* (2013.01); *G11C 16/0408* (2013.01); *G11C 29/52* (2013.01); *G11C 2029/0411* (2013.01)

(56) References Cited

U.S. PATENT DOCUMENTS

| | | | |
|---|---|---|---|
| 2003/0081458 A1* | 5/2003 | Kurihara | G11C 16/0475 365/185.03 |
| 2006/0039199 A1* | 2/2006 | Gratz | G11C 16/26 365/185.33 |
| 2012/0239991 A1* | 9/2012 | Melik-Martirosian | G06F 11/3034 714/708 |

* cited by examiner

Figure 5A

Figure 5B

CONTROLLER FOR A SOLID-STATE DRIVE, AND RELATED SOLID-STATE DRIVE

BACKGROUND OF THE INVENTION

Field of the Invention

The present invention generally relates to "Solid State Drives" (hereinafter, SSD devices), such as SSD devices provided with non-volatile memory chips (e.g., NAND flash memory chips) for storing data. More particularly, the present invention relates to SSD devices provided with error correction capabilities.

Overview of the Related Art

SSD devices are nowadays widely used, for example as storage units of computers in replacement of HDD ("Hard Disk Drives").

A common SSD device comprises non-volatile memory chips (for example, NAND flash memory chips) each one including non-volatile memory cells for storing data (bits) even in the absence of external power supply, and a SSD device controller (hereinafter, SSD controller) for managing SSD device operations, such as write/program, erase and read operations.

Each memory cell comprises a floating gate transistor. Each bit or group of bits (identifying a respective logical state of the memory cell) is physically stored in each memory cell in the form of electric charge in the floating gate, which defines a corresponding threshold voltage of the transistor. The number of bits each memory cell is capable of storing depends on memory cell technology. For example, in "Single-Level Cell" (SLC) technology each memory cell (or SLC memory cell) is capable of storing one symbol comprising one bit (i.e. two logical states, 0 or 1, defining two threshold voltages), in "Multi-Level Cell" (MLC) technology each memory cell (or MLC memory cell) is capable of storing one symbol comprising more than one bit, typically two bits (i.e. four logical states, 00, 01, 10, or 11, defining four threshold voltages), whereas in "Tri-Level Cell" technology each memory cell (or TLC memory cell) is capable of storing one symbol comprising three bits (i.e. eight logical states, 000, 001, 010, 011, 100, 101, 110 or 111, defining eight threshold voltages).

While, ideally, all memory cells in a memory chip should feature same (nominal) threshold voltages for same logical states (or, equivalently, for same symbols), practically each threshold voltage associated with a corresponding logical state (or, equivalently, with a corresponding symbol) differs across the memory cells and defines a respective threshold voltage distribution (typically, a Gaussian-type probability distribution), thus resulting in a number of threshold voltage distributions equal to the possible logical states each memory cell can take.

Ideally, the threshold voltage distributions are spaced apart from one another, and a corresponding reference voltage is set between each pair of adjacent threshold voltage distributions for sensing/reading the logical state of the memory cells. This is schematically shown in the top drawing of FIG. 2B for a MLC memory cell and in the top drawing of FIG. 2C for a TCL memory cell.

Figure 2A:
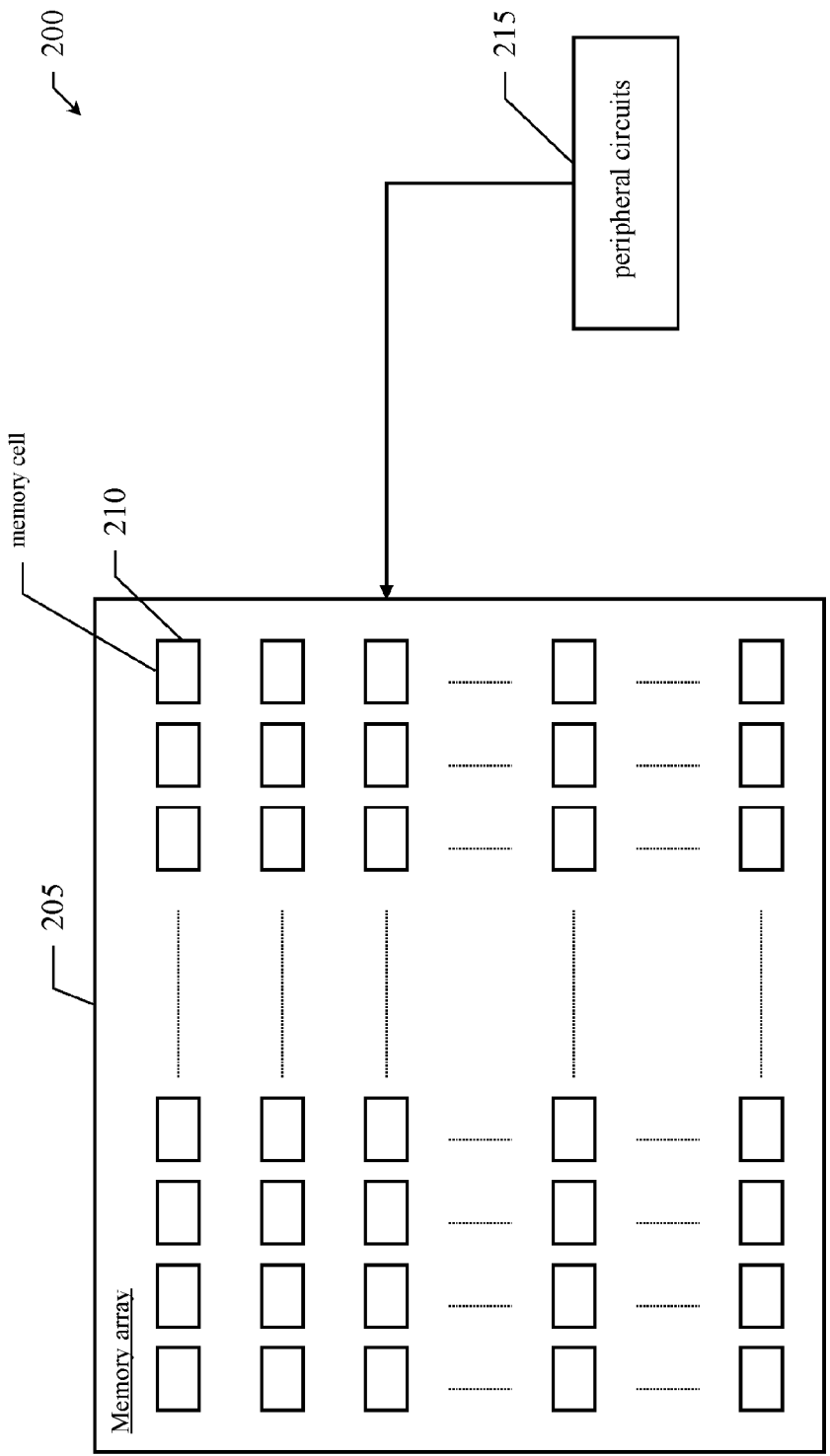
Figure 2B:
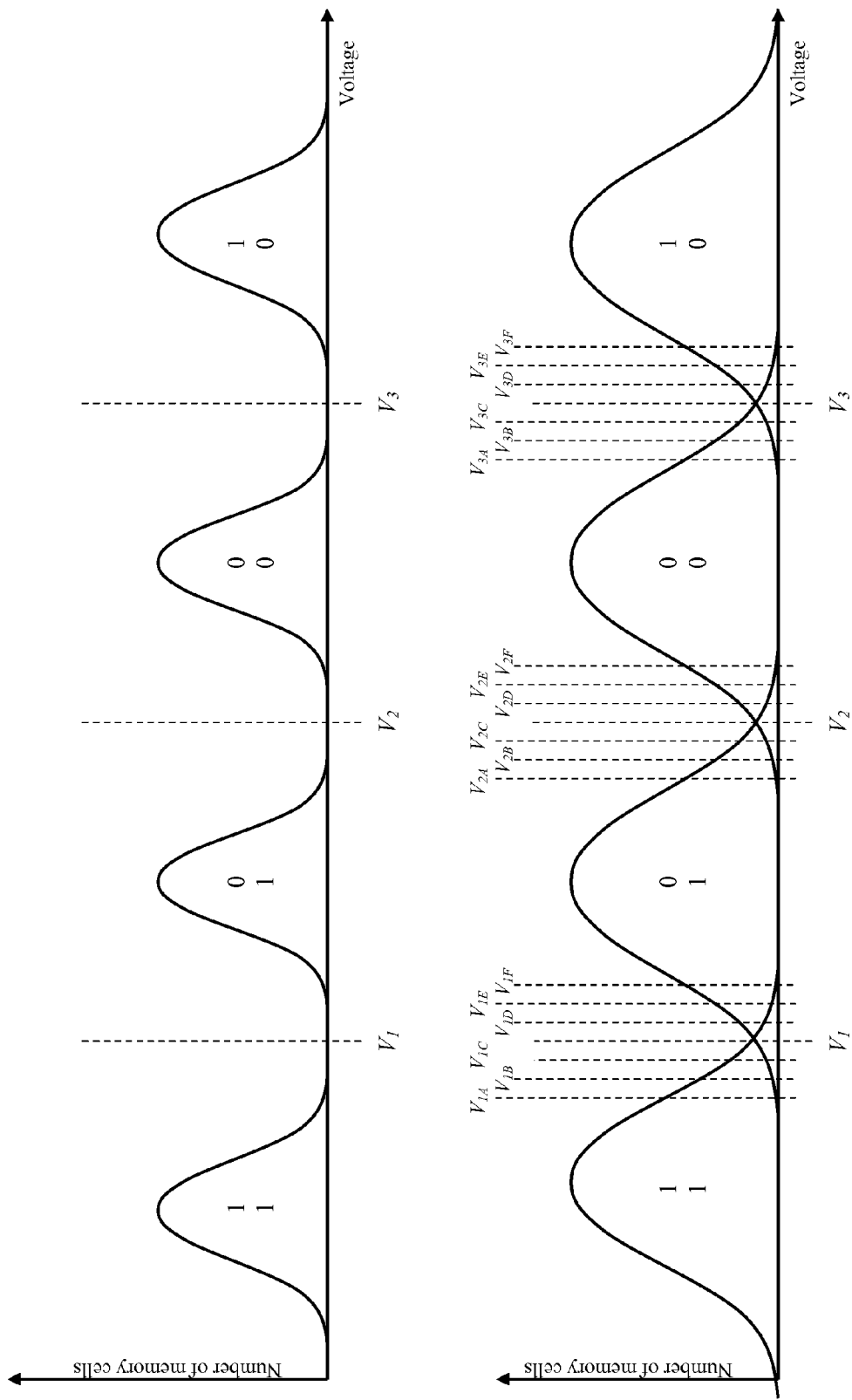
Figure 2C:
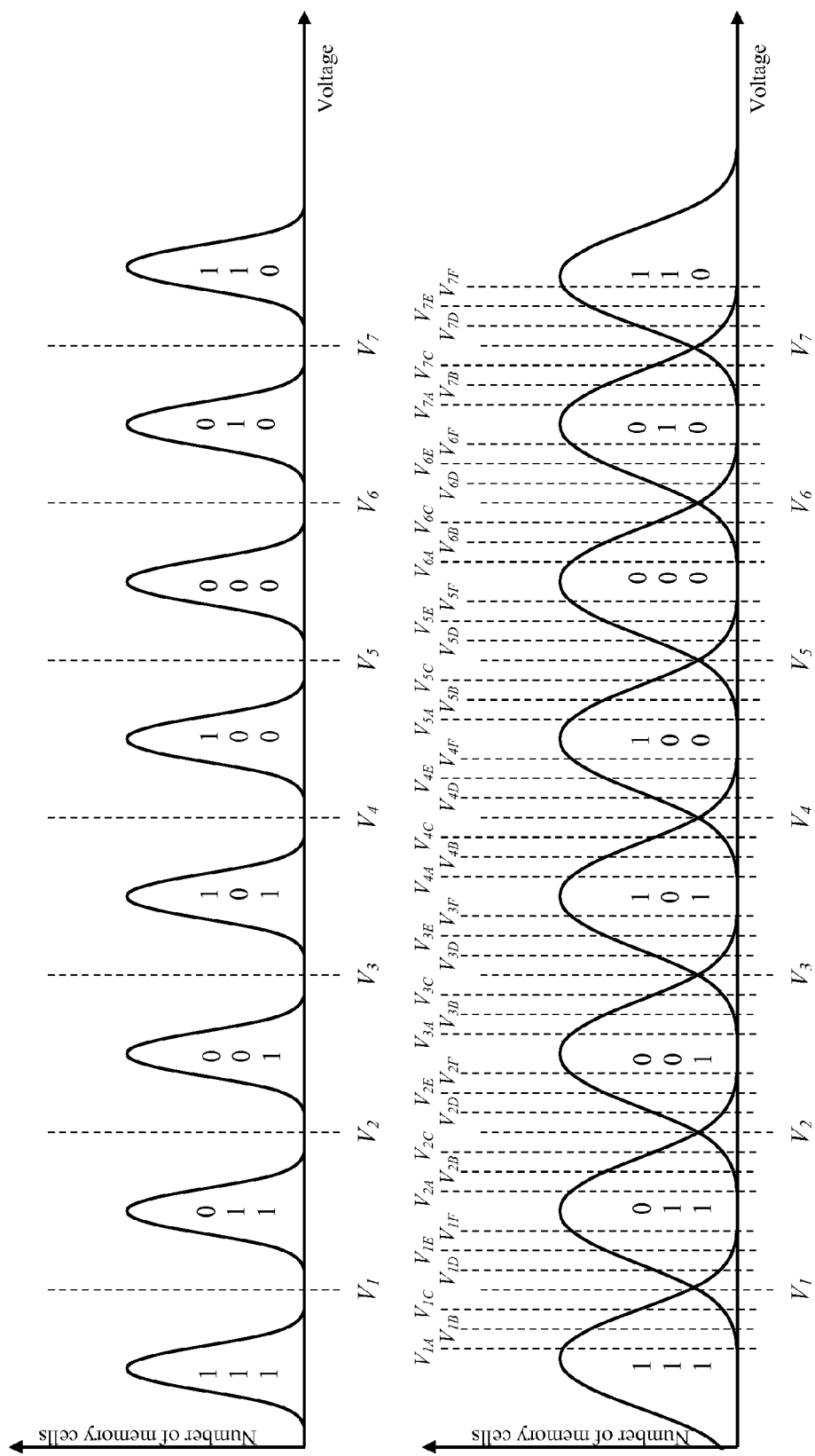

As visible in these drawings, the threshold voltage distributions are (ideally) spaced apart from one another, and a corresponding reference voltage $V_k$ is set between each pair of adjacent threshold voltage distributions for sensing/reading the logical state of the memory cells (k=1, 2, 3 in the example of FIG. 2B and k=1, 2, 3, 4, 5, 6, 7 in the example of FIG. 2C).

In case of the MLC memory cell, during a reading operation a threshold voltage below the reference voltage $V_1$ represents the bit pattern "11", a threshold voltage between the reference voltages $V_1$ and $V_2$ represents the bit pattern "01", a threshold voltage between the reference voltages $V_2$ and $V_3$ represents the bit pattern "00", and a threshold voltage above the reference voltage $V_3$ represents the bit pattern "10".

In case of the TLC memory cell, during a reading operation, a threshold voltage below the reference voltage $V_1$ represents the bit pattern "111", a threshold voltage between the reference voltages $V_1$ and $V_2$ represents the bit pattern "011", a threshold voltage between the reference voltages $V_2$ and $V_3$ represents the bit pattern "001", a threshold voltage between the reference voltages $V_3$ and $V_4$ represents the bit pattern "101", a threshold voltage between the reference voltages $V_4$ and $V_5$ represents the bit pattern "100", a threshold voltage between the reference voltages $V_5$ and $V_6$ represents the bit pattern "000", a threshold voltage between the reference voltages $V_6$ and $V_7$ represents the bit pattern "010", and a threshold voltage above the reference voltage $V_7$ represents the bit pattern "110".

To read a memory cell, the threshold voltage of the memory cell is compared to the reference voltages $V_k$. Typically, reading a memory cell that stores a symbol of m bits requires, for at least one page of memory cells (hereinafter, memory page), m such comparisons.

For example, when m=3, such as in the TLC memory cell, the threshold voltage is first compared to the reference voltage $V_4$. Depending on the outcome of that comparison, the threshold voltage is then compared either to the reference voltage $V_2$ or to the reference voltage $V_6$. Depending on the outcome of the second comparison, the threshold voltage is then compared either to the reference voltages $V_1$ or $V_3$ or to the reference voltages $V_5$ or $V_7$.

However, the increasing of the number of bits per memory cell causes, for a same threshold voltage distribution space (i.e., for the same allowed maximum and minimum threshold voltages), a higher number of threshold voltage distributions. A higher number of threshold voltage distributions in the same threshold voltage distribution space results in threshold voltage distributions that are closer to each other. This makes the memory cells more prone to suffer severe cell-to-cell interference and retention noise, which translates into partially overlapping areas of adjacent threshold voltage distributions (shown in the bottom drawings of FIGS. 2B and 2C) and, hence, into the increasing of the number of bit errors.

In order to compensate for larger bit errors, and to increase SSD device reliability, "Forward Error Correction" has been proposed (and typically implemented in the SSD controller) for locating and correcting bit errors. According to "Forward Error Correction" principles, the bits to be stored are encoded in a redundant way (e.g., by adding parity bits) by means of an "Error Correction Code" (ECC code), so that redundancy allows detecting a limited number of bit errors that may occur anywhere in the read bits, and to correct these errors without rereading. Generally, the number of detectable and correctable bit errors increases as the number of parity bits in the ECC code increases.

The probability of corrupted read bits, which therefore contains incorrect bits, before correction is referred to as "Raw Bit Error Rate" (RBER). As a result of the advances in memory cell technology, the RBER for a selected memory page is increasingly nearing the Shannon limit of the communication channel. The RBER observed after application of the ECC code is referred to as "Frame Bit Error Rate"

(FER), whereas the FER divided by the number of read bits is referred to as "Uncorrectable Bit Error Rate" (UBER).

The acceptable UBER is often dependent upon the application in which the SSD device is intended to be employed. In the case of price sensitive, consumer applications, which experience a relatively low number of accesses (e.g., program/erase cycles), the SSD device may tolerate a higher UBER as compared to a high-end application experiencing a relatively high number of accesses, such as an enterprise application.

To achieve an acceptable UBER, especially for enterprise applications, "Low-Density Parity-Check" (LDPC) codes have been widely used (both alone and in combination with other ECC codes), which allow determining each bit value (hard decoding) as well as each bit reliability (soft decoding) in terms of soft bits.

For example, according to a known solution, the SSD controller comprises a hard encoding unit for hard encoding the bits to be stored/written by means of a hard ECC code, such as "Bose-Chaudhuri-Hocquenghem" (BCH) code (the hard encoding unit and the hard encoded bits being thus referred to as BCH encoding unit and BCH encoded bits, respectively), and a LDPC encoding unit for encoding the BCH encoded bits by means of the LDPC code. The SSD controller also comprises soft decoding and hard decoding units for carrying out soft decoding and hard decoding operations (based on LDPC and BCH codes, respectively) on the read bits (the soft decoding and hard decoding units being thus referred to as LDPC decoding and BCH decoding units, respectively).

In this solution, the soft bits mainly arise from multiple reading operations. Indeed, according to a common approach, when a reading operation takes place on a selected memory page, and the number of bit errors is found to be higher than correction capabilities of the "Forward Error Correction", the flash memory device (e.g., the SSD controller thereof) is typically configured to reread the selected memory page at different values of the reference voltages to attempt to establish the bits in those areas of the threshold voltage distributions wherein bit error is most likely. Such multiple readings are typically carried out by moving the reference voltages $V_k$ in a neighborhood thereof, thus obtaining a number of (e.g. six, as exemplary shown in the bottom drawings of FIGS. 2B and 2C) additional reference voltages $V_{kA}$-$V_{kF}$ associated with each reference voltage $V_k$ (in the following, the overall reference voltages including both the reference voltages $V_k$ and the associated additional reference voltages $V_{kA}$-$V_{kF}$ will be denoted by reference voltages $V_{kA}, V_{kA}$-$V_{kF}$ for the sake of conciseness).

U.S. Pat. No. 8,892,986 discloses methods and apparatuses for combining error coding and modulation schemes. One or more methods include encoding data using linear error correcting code, modulating the encoded data, writing the modulated data to memory, and decoding the written data using a Viterbi algorithm and a linear error correcting code decoder.

SUMMARY OF THE INVENTION

The Applicant has recognized that nowadays SSD devices based on MLC and TLC technologies (hereinafter, MLC and TLC SSD devices) are not satisfactory in terms of error correction capabilities (and, hence, in terms of UBER). Indeed, a high UBER translates into poor reliability and lifetime of the SSD device in terms of sustainable program/erase cycles.

Although decreasing the code rate (i.e., the ratio between the information bits to the (LDPC, in the case at issue) encoding unit and the total number of bits generated by the encoding unit, the total number of bits generated by the encoding unit including the parity bits) for BCH codes could seem a viable approach for increasing error correction capabilities, however this would reduce the storage capacity of the SSD device.

Moreover, LDPC decoding requires soft bits, which in the above-discussed solution translates into multiple readings. However moving the reference voltages $V_k$ could result in very expensive read access times for conventional LDPC decoding units. These issues are exacerbated in nowadays SSD devices, which are smaller and smaller and whose bits per memory cell are increasingly growing, as the narrow distance between the threshold voltage distributions requires more and more soft bits to make LDPC decoding unit work properly. For example, in a 2-bit MLC SSD device, 3 reference voltages $V_k$ are needed for the BCH decoding unit and up to 21 references voltages $V_{kA}, V_{kA}$-$V_{kF}$ (as illustrated in the bottom drawing of FIG. 2B) or more thereof (depending on the desired resolution) are needed for the LDPC decoding unit, whereas in a TLC SSD device, 7 reference voltages $V_k$ are needed for the BCH decoding unit and up to 49 references voltages $V_{kA}, V_{kA}$-$V_{kF}$ (as illustrated in the bottom drawing of FIG. 2B) or more thereof (depending on the desired resolution) are needed for the LDPC decoding unit.

Last but not least, the Applicant has also understood that nowadays enterprise MLC and TLC SSD devices are excessively expensive as compared to their performance in terms of UBER. By way of example only, it could be estimated that an enterprise MLC SSD device cost is seven times higher than a consumer TLC SSD device.

The Applicant has tackled the above-discussed issues, and has devised a SSD controller for obtaining respective SSD devices having high error correction capabilities and low costs.

One or more aspects of the present invention are set out in the independent claims, with advantageous features of the same invention that are indicated in the dependent claims, whose wording is enclosed herein verbatim by reference.

More specifically, an aspect of the present invention relates to a controller for a solid state drive. The solid state drive comprises a plurality of memory cells, wherein each memory cell comprises a floating gate transistor for storing a symbol when programmed with a threshold voltage associated with that symbol, and wherein each threshold voltage is variable over the memory cells of the plurality of memory cells thereby defining a corresponding threshold voltage distribution. The controller comprises:

an encoding unit for encoding information bits into encoded bits;

a mapping unit for mapping the encoded bits into symbols to be stored, each one for being stored into a respective target memory cell, said mapping unit mapping the encoded bits by associating the symbols to be stored with the target memory cells in such a way that the threshold voltage distributions associated with said symbols to be stored define overlapping regions smaller than a predetermined overlapping region indicative of an admitted bit error rate;

a demapping unit for demapping read symbols read from the target memory cells and providing metrics indicative of a distance between the threshold voltage distributions associated with said read symbols, a conversion unit for converting said metrics into an indication of the reliability of the read symbols, and a soft decoding unit for soft decoding the read symbols according to said indication of the reliability of the read symbols thereby obtaining said information bits.

According to an embodiment of the present invention, said mapping unit further maps the encoded bits by associating the symbols to be stored with the target memory cells according to a criterion of maximization of distance among the threshold voltage distributions associated with said symbols to be stored.

According to an embodiment of the present invention, said mapping unit further maps the encoded bits by determining a plurality of allowed symbols that are allowed to be written in the target memory cells according to a criterion of maximization of distance among the threshold voltage distributions associated therewith, said symbols to be stored being a subset of said plurality of allowed symbols.

According to an embodiment of the present invention, each memory cell can store a symbol among a plurality of possible symbols that the memory cell is designed to store, and said mapping comprises determining a plurality of allowed symbols that are allowed to be written in the target memory cells according to a criterion of maximization of distance among the threshold voltage distributions associated therewith. Said plurality of allowed symbols is a subset of said plurality of allowed symbols so that at least one forbidden symbol that is not allowed to be written in the target memory cells is defined among the plurality of possible symbols, said symbols to be stored being a subset of said plurality of allowed symbols.

According to an embodiment of the present invention, the plurality of possible symbols define a succession of possible symbols, adjacent possible symbols of the succession differing from each other for one bit. At least one allowed symbol of said plurality of allowed bit symbols is adjacent to said at least one forbidden bit symbol.

According to an embodiment of the present invention, each bit symbol that each memory cell is designed to store comprises three bits defining a succession of eight possible symbols. The plurality of allowed symbols comprise five allowed symbols among the eight possible symbols and the at least one forbidden symbol comprises three forbidden symbols each one adjacent to at least one allowed symbol of said five allowed symbols in order to comply with said criterion of maximization of distance.

According to an embodiment of the present invention, the controller further comprises a convolutional encoding unit for convolutionally encoding a first portion of the encoded bits into convolutionally encoded bits, said mapping unit further mapping the encoded bits based on a 4-Dimensional mapping scheme applied to said convolutionally encoded bits and to a second portion of the encoded bits not convolutionally encoded.

According to an embodiment of the present invention, said demapping unit comprises a "Soft Output Viterbi Algorithm" (SOVA) unit.

According to an embodiment of the present invention, said metrics are voltage levels indicative of the distances among the threshold voltage distributions associated with said read symbols.

According to an embodiment of the present invention, said indication of the reliability of the read symbols provided by the conversion unit from said metrics comprises, for each read symbol, a logarithmic ratio between the respective metrics.

According to an embodiment of the present invention, said encoding unit and said soft decoding unit are based on a "Low Density Parity Check" (LDPC) code.

According to an embodiment of the present invention, said encoding unit and said soft decoding unit are based on a "Quasi-Cyclic Low Density Parity Check" (QC LDPC) code.

According to an embodiment of the present invention, the memory cells are programmed and read simultaneously at memory page level, and each memory cell can store a symbol among a plurality of possible symbols that the memory cell is designed to store, each symbol comprising bits associated with different memory pages. When a bit error rate of a memory page overruns the admitted bit error rate, said mapping unit maps the encoded bits by:

marking that memory page as a failed memory page and the associated bit as a failed bit, each memory page other than a failed memory page being associated with an unfailed bit, and for the memory cells associated with the failed memory page, determining a plurality of allowed symbols that are allowed to be written in those memory cells, said plurality of allowed symbols being a subset of the plurality of the possible symbols so that at least one forbidden symbol that is not allowed to be written in those memory cells is defined among the plurality of possible symbols, said plurality of allowed symbols being selected according to a criterion of maximization of distance among the threshold voltage distributions associated therewith and such as to include all possible bit combinations of the unfailed bits.

Another aspect of the present invention relates to a controller for a solid state drive. The solid state drive comprises a plurality of memory cells programmed and read simultaneously at memory page level. Each memory cell comprises a floating gate transistor for storing a symbol, among a plurality of possible symbols that the memory cell is designed to store, when programmed with a threshold voltage associated with that symbol, each threshold voltage being variable over the memory cells of the plurality of memory cells thereby defining a corresponding threshold voltage distribution, and each symbol comprising bits associated with different memory pages. The controller comprises:

an encoding unit for encoding information bits into encoded bits;

a mapping unit for mapping the encoded bits into symbols to be stored each one for being stored into a respective target memory cell, when a bit error rate of a memory page overruns an admitted bit error rate, said mapping unit mapping the encoded bits by:

marking that memory page as a failed memory page and the associated bit as a failed bit, each memory page other than a failed memory page being associated with an unfailed bit, and for the memory cells associated with the failed memory page, determining a plurality of allowed symbols that are allowed to be written in those memory cells, said plurality of allowed symbols being a subset of the plurality of the possible symbols so that at least one forbidden symbol that is not allowed to be written in those memory cells is defined among the plurality of possible symbols, said plurality of allowed symbols being selected in such a way that the threshold voltage distributions associated therewith define overlapping regions smaller than a predetermined overlapping region indicative of the admitted bit error rate and such as to include all possible bit combinations of the unfailed bits, said symbols to be stored being a subset of said plurality of allowed symbols;

a demapping unit for demapping read symbols read from the target memory cells and providing an indication of the reliability of the read symbols, and a soft decoding unit for soft decoding the read symbols according to said indication of the reliability of the read symbols thereby obtaining said information bits, A further aspect of the present invention relates to a solid state drive. The solid state drive comprises:

a plurality of memory cells, wherein each memory cell comprises a floating gate transistor for storing a symbol when programmed with a threshold voltage associated with that symbol, and wherein each threshold voltage is variable over the memory cells of the plurality of memory cells thereby defining a corresponding threshold voltage distribution;

an encoding unit for encoding information bits into encoded bits;

a mapping unit for mapping the encoded bits into symbols to be stored, each one for being stored into a respective target memory cell, said mapping comprising associating the symbols to be stored with the target memory cells in such a way that the threshold voltage distributions associated with said symbols to be stored define overlapping regions smaller than a predetermined overlapping region indicative of an admitted bit error rate;

a demapping unit for demapping read symbols read from the target memory cells and providing metrics indicative of a distance between the threshold voltage distributions associated with said read symbols, a conversion unit for converting said metrics into an indication of the reliability of the read symbols, and a soft decoding unit for soft decoding the read symbols according to said indication of the reliability of the read symbols thereby obtaining said information bits.

According to an embodiment of the present invention, said mapping unit further maps the encoded bits by associating the symbols to be stored with the target memory cells according to a criterion of maximization of distance among the threshold voltage distributions associated with said symbols to be stored.

According to an embodiment of the present invention, said mapping unit further maps the encoded bits by determining a plurality of allowed symbols that are allowed to be written in the target memory cells according to a criterion of maximization of distance among the threshold voltage distributions associated therewith, said symbols to be stored being a subset of said plurality of allowed symbols.

According to an embodiment of the present invention, each memory cell can store a symbol among a plurality of possible symbols that the memory cell is designed to store, and said mapping comprises determining a plurality of allowed symbols that are allowed to be written in the target memory cells according to a criterion of maximization of distance among the threshold voltage distributions associated therewith. Said plurality of allowed symbols are a subset of said plurality of allowed symbols so that at least one forbidden symbol that is not allowed to be written in the target memory cells is defined among the plurality of possible symbols, said symbols to be stored being a subset of said plurality of allowed symbols.

According to an embodiment of the present invention, the plurality of possible symbols define a succession of possible symbols, adjacent possible symbols of the succession differing from each other for one bit, and at least one allowed symbol of said plurality of allowed symbols being adjacent to said at least one forbidden symbol.

According to an embodiment of the present invention, each symbol that each memory cell is designed to store comprises three bits defining a succession of eight possible symbols. The plurality of allowed symbols comprise five allowed symbols among the eight possible symbols and the at least one forbidden symbol comprises three forbidden symbols each one adjacent to at least one allowed symbol of said five allowed symbols in order to comply with said criterion of maximization of distance.

According to an embodiment of the present invention, the solid state drive further comprises a convolutional encoding unit for convolutionally encoding a first portion of the encoded bits into convolutionally encoded bits, said mapping unit further mapping the encoded bits based on a 4-Dimensional mapping scheme applied to said convolutionally encoded bits and to a second portion of the encoded bits not convolutionally encoded.

According to an embodiment of the present invention, said demapping unit comprises a "Soft Output Viterbi Algorithm" (SOVA) unit.

According to an embodiment of the present invention, said metrics are voltage levels indicative of the distances among the threshold voltage distributions associated with said read symbols.

According to an embodiment of the present invention, said indication of the reliability of the read symbols provided by the conversion unit from said metrics comprises, for each read symbol, a logarithmic ratio between the respective metrics.

According to an embodiment of the present invention, said encoding unit and said soft decoding unit are based on a "Low Density Parity Check" (LDPC) code.

According to an embodiment of the present invention, said encoding unit and said soft decoding unit are based on a "Quasi-Cyclic Low Density Parity Check" (QC LDPC) code.

According to an embodiment of the present invention, the memory cells are programmed and read simultaneously at memory page level, and each memory cell can store a symbol among a plurality of possible symbols that the memory cell is designed to store, each symbol comprising bits associated with different memory pages. When a bit error rate of a memory page overruns the admitted bit error rate, said mapping unit maps the encoded bits by:

marking that memory page as a failed memory page and the associated bit as a failed bit, each memory page other than a failed memory page being associated with an unfailed bit, and for the memory cells associated with the failed memory page, determining a plurality of allowed symbols that are allowed to be written in those memory cells, said plurality of allowed symbols being a subset of the plurality of the possible symbols so that at least one forbidden symbol that is not allowed to be written in those memory cells is defined among the plurality of possible symbols, said plurality of allowed symbols being selected according to a criterion of maximization of distance among the threshold voltage distributions associated therewith and such as to include all possible bit combinations of the unfailed bits.

According to an embodiment of the present invention, said memory cells are non-volatile memory cells.

According to an embodiment of the present invention, said memory cells are flash memory cells.

According to an embodiment of the present invention, said memory cells are NAND flash memory cells.

BRIEF DESCRIPTION OF THE ANNEXED DRAWINGS

Figure 1B:
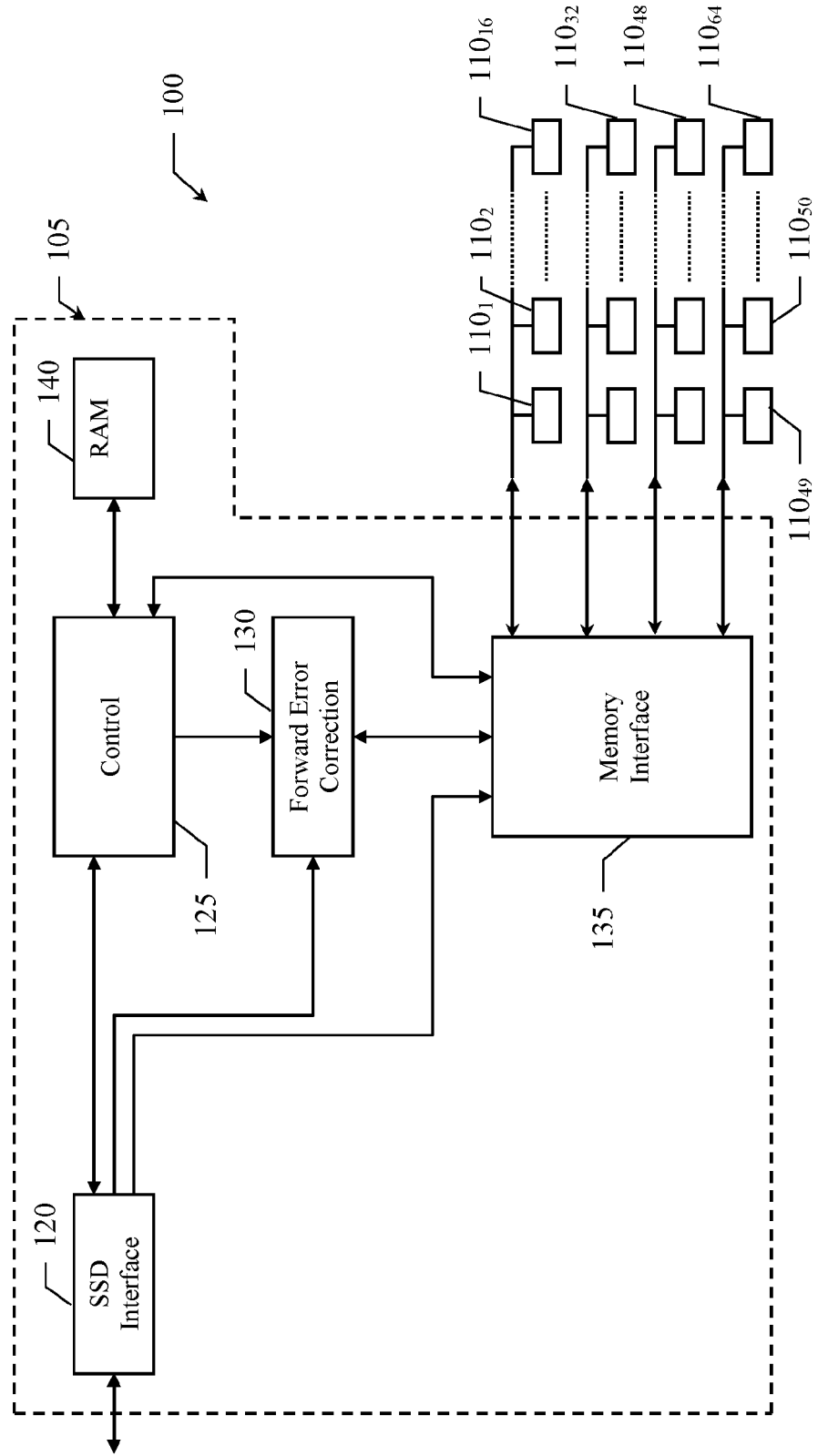
Figure 3A:
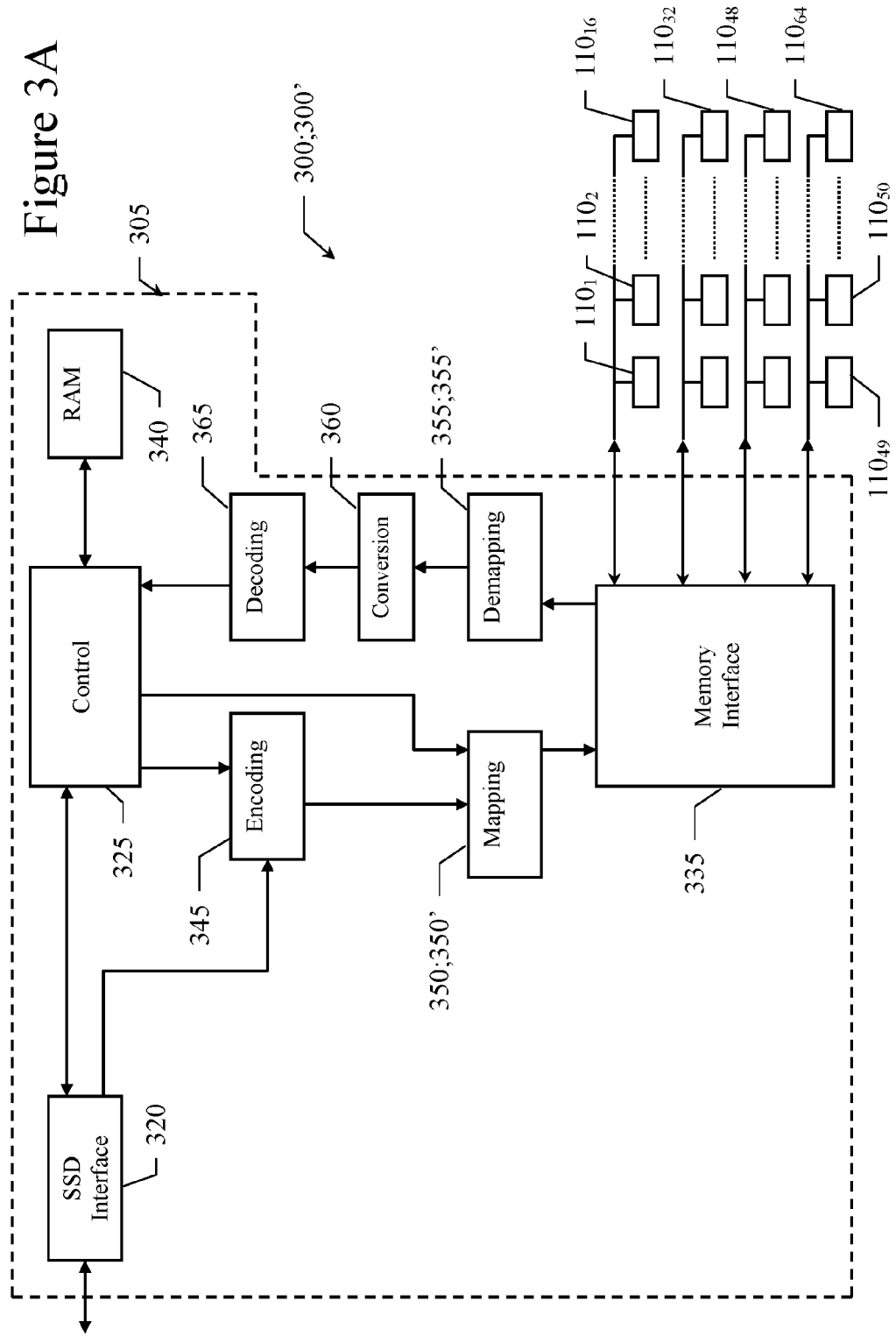
Figure 3B:
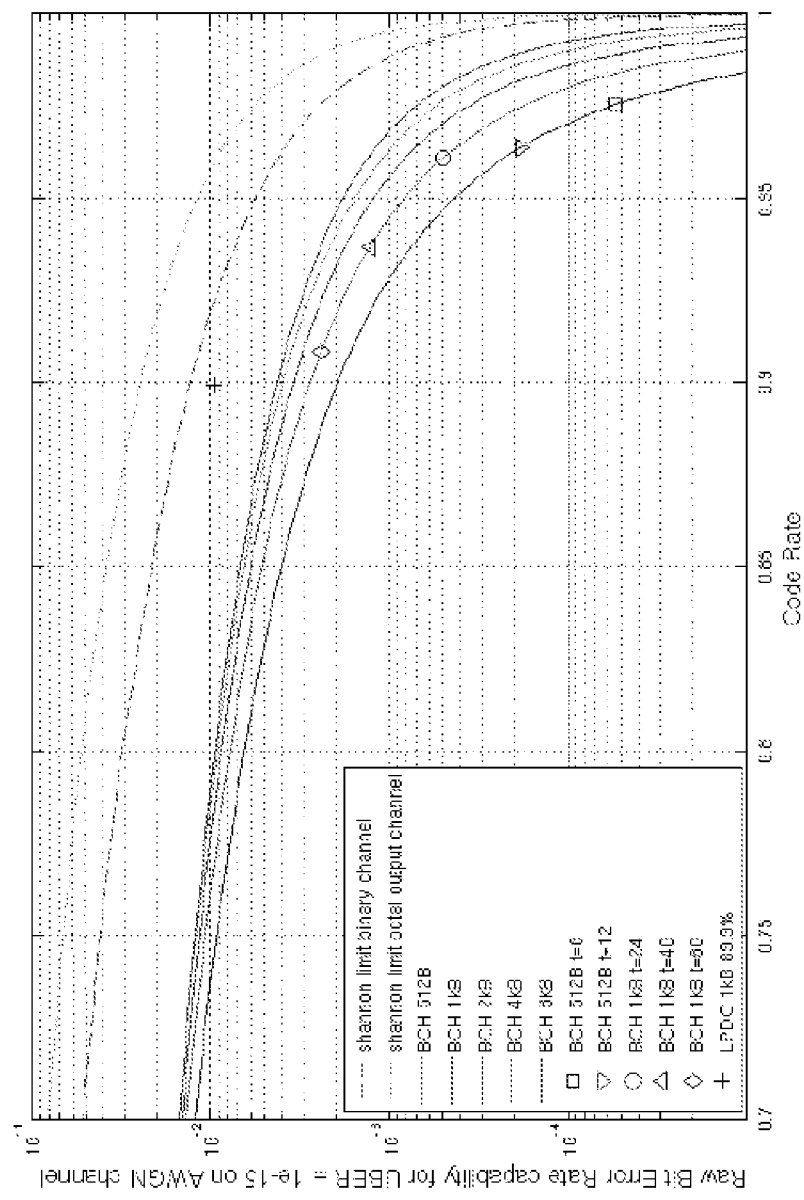
Figure 4A:
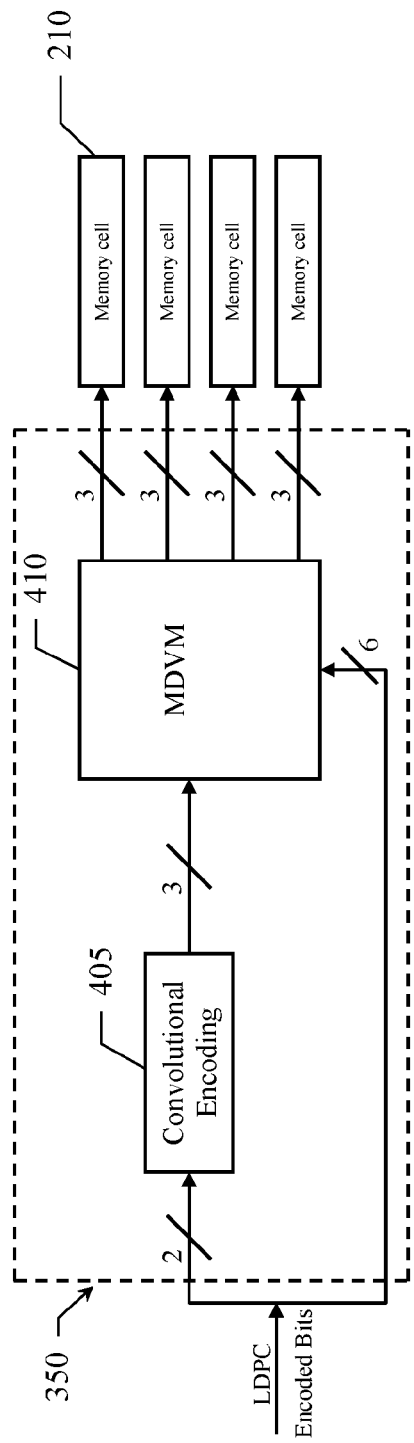
Figure 4C:
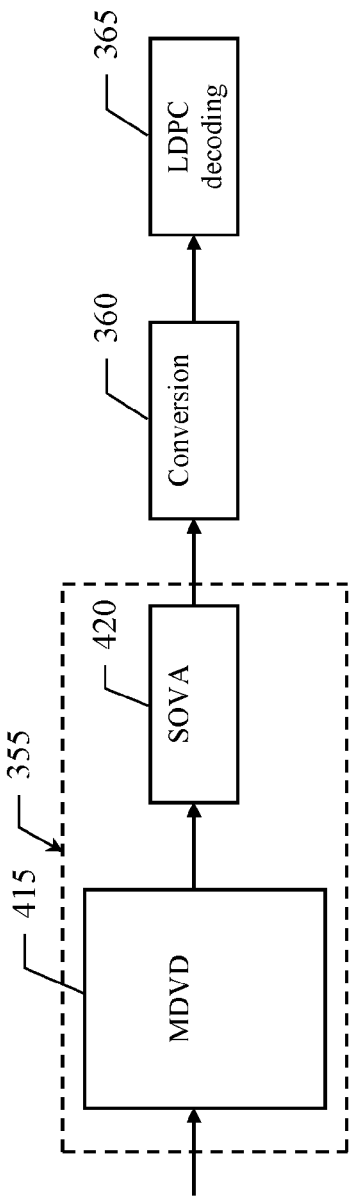
Figure 4B:
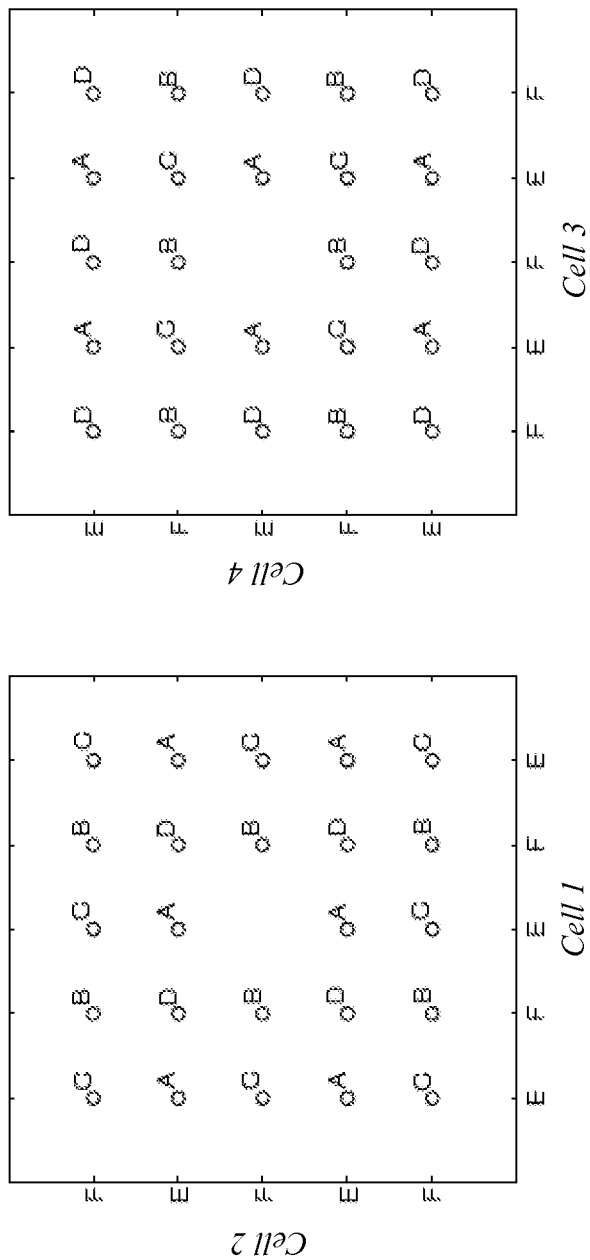

These and other features and advantages of the present invention will be made apparent by the following description of some exemplary and non-limitative embodiments thereof. For its better intelligibility, the following description should be read making reference to the attached drawings, wherein:

FIG. 1A schematically shows a simplified architecture of a SSD device known in the state of the art;

FIG. 1B schematically shows a simplified architecture of a typical SSD controller of said SSD device;

FIG. 2A schematically shows a simplified architecture of a typical flash memory die of said SSD device;

FIGS. 2B and 2C schematically show exemplary ideal and real threshold voltage distributions of MLC memory cells and of TLC memory cells, respectively, of said flash memory die;

FIG. 3A schematically shows a simplified architecture of a SSD controller according to the principles of the present invention;

FIG. 3B shows a diagram of "Raw Bit Error Rate" capability, with respect to code rate, of some exemplary ECC codes, including a "Low Density Parity Check" code that can be used in the "Forward Error Correction" unit of the SSD controller of FIG. 3A;

FIGS. 4A, 4B and 4C schematically show a simplified architecture of a mapping unit of the SSD controller of FIG. 3A, a mapping scheme of such a mapping unit, and a simplified architecture of a demapping unit of the SSD controller of FIG. 3A, respectively, according to an embodiment of the present invention, and FIGS. 5A-5D conceptually show corresponding steps of a mapping scheme of a mapping unit of the SSD controller of FIG. 3A according to another embodiment of the present invention.

DETAILED DESCRIPTION OF PREFERRED EMBODIMENTS OF THE INVENTION

With reference to the drawings, FIG. 1A schematically shows a simplified architecture of a "Solid State Drive" device (SSD device) 100 known in the state of the art.

The SSD device 100 preferably comprises a controller (e.g., a processor and/or other control circuitry, referred to herein as SSD controller) 105, a plurality of non-volatile memory chips (e.g. flash memory chips, such as NAND flash memory chips) $110_i$ for storing bits even in the absence of external power supply (i=1, 2, 3, . . . , I, with I=64 in the example at issue), and a plurality of (e.g., synchronous and/or asynchronous) channels $115_j$ (j=1, 2, 3, . . . , J, with J=4 in the example at issue) communicably coupling the SSD controller 105 and the memory chips $110_i$ to each other—in the exemplary illustration, each channel $115_j$ communicably couples the SSD controller 105 to a set of 16 memory chips $110_i$ (e.g., with the channels $115_1$, $115_2$, $115_3$ and $115_4$ that communicably couple the SSD controller 105 to the memory chips $110_1$-$110_{16}$, $110_{17}$-$110_{32}$, $110_{33}$-$110_{48}$ and $110_{49}$-$110_{64}$, respectively).

With reference also to FIG. 1B, it schematically shows, in terms of operating units, a simplified architecture of a typical SSD controller 105—the term "unit" being herein intended to emphasize functional (rather than implementation) aspects thereof. For the sake of completeness, such a figure also shows, with a smaller size, the memory chips $110_i$ and the channels $115_j$ (the memory chips and the channels being unnumbered in such a figure for ease of illustration).

The SSD controller 105 comprises a SSD interface unit 120 allowing data exchange (i.e., data sending and reception in a bi-directional way) between the SSD device 100 and a host (e.g., a host system such as a personal laptop computer, a desktop computer, a digital camera, a mobile telephone, or a memory card reader, not shown) having compatible receptors for the SSD interface unit 120. The SSD interface unit 120 may be in the form of a standardized interface. For example, when the SSD device 100 is used for data storage in a computing system, the SSD interface unit 120 can be a "Serial advanced technology attachment" (SATA), a "Peripheral Component Interconnect express" (PCIe), or a "Universal Serial Bus" (USB).

Data exchanged between the SSD device 100 (through the SSD interface unit 120 of the SSD controller 105) and the host may comprise, but are not limited to, information bits to be stored (i.e., the information bits to be written in the memory chips $110_i$), read information bits (i.e., the information bits stored in, and read from, the memory chips $110_i$), user commands indicative of the operations to be performed by the SSD controller 105 on the memory chips $110_i$ (such as write, read, diagnosis operations), and other control signals. For the purposes of the present description, the wording "data exchange", and derivative thereof, will be intended to mean a bi-directional exchange (i.e., sending and reception) of data between two units (although this should not be construed limitatively). This is also conceptually represented in the figure by bi-directional arrow connections between the units.

The SSD controller 105 also comprises a control unit 125 (or more thereof) for managing SSD device 100 operation, such as for receiving and processing the user commands from the SSD interface unit 120, handling bit transport to the memory chips $110_i$ along the channels 115 and bit transport to and from the SSD interface unit 120, and coordinating enabling and/or disabling of the memory chips $110_i$ according to the user commands.

In order to compensate for large "Raw Bit Error Rate" (RBER), and to increase reliability of the SSD device 100, the SSD controller 105 also comprises a "Forward Error Correction" (FEC) unit 130 for locating and correcting bit errors. According to "Forward Error Correction" principles, the information bits to be stored in the memory chips $110_i$ (and provided either by the control unit 125 or, directly, from the SSD interface unit 105) are encoded in a redundant way (e.g., by adding parity bits) by means of an "Error Correction Code" (ECC code), so that redundancy allows detecting a limited number of bit errors that may occur anywhere in the read bits, and to correct these errors, during decoding, without rereading. The FEC unit 130 may comprise discrete components—such as an "Application Specific Integrated Circuit" (ASIC)—external to the control unit 125 (as herein assumed by way of example only), or the FEC unit 130 may reflect functionalities that do not necessarily have a discrete physical form separate from the control unit 125.

In order to ease bits transport between the SSD controller 105 and the memory chips $110_i$ along the respective channels $115_j$, the SSD controller 105 comprises one (as herein exemplary illustrated) or more memory interface units 135—alternatively, a memory interface unit 135 for each channel $115_j$ can be provided, or a memory interface unit 135 for each memory chip $110_i$, or for each group of memory chips $110_i$ can be provided.

As conceptually depicted in the figure by (unidirectional or bi-directional) arrow connections, which however should not be construed limitatively, the memory interface unit 135 is communicably coupled in a unidirectional manner to the SSD interface 120 (e.g., for receiving from it the information bits to be written when no ECC code is requested), and in a bi-directional manner to the control unit 125 (e.g., for receiving control information from it, such as an indication of the memory chips $110_i$ to be enabled for write or read operations, and for providing to it the read bits to be transmitted to the SSD interface unit 120) and to the FEC unit 130 (for example, for receiving encoded bits from it, e.g. including the information and parity bits, and for providing to it the read bits to be decoded before transmitting to the control unit 125, and hence to the SSD interface unit 120, the read information bits).

The SSD controller 105 further comprises a memory unit (e.g., a "Random Access Memory", RAM) 140 communicably coupled (in a bi-directional manner) to the control unit 125 for receiving and storing statistical information (such as number of program/erase cycles, and number of bit errors) and/or diagnostic information (such as working temperature, power consumption) retrieved and/or calculated by the control unit 125 (e.g. based on SSD device 100 operation and/or on sensors and/or diagnostic circuits within the SSD device 100, not shown), and, when required, for feeding the control unit 125 with the stored information.

A typical flash memory chip $110_i$ may comprise one or more flash memory dice.

A typical flash memory die, illustrated in FIG. 2A and denoted by the number reference 200, comprises one (as depicted) or more memory arrays 205 of memory cells (e.g., NAND flash memory cells) 210 arranged in rows and columns. Each memory array 205 is typically divided into multiple memory pages. Broadly speaking, each memory page comprises a number of memory cells 210 that can be programmed and read simultaneously. A number of memory pages form a memory block, and the size of the memory block equals to the product of the size of the memory page and the total number of memory pages in the memory block.

In some embodiments, each memory page comprises a respective (e.g., entire) row of the memory array 205. In alternative embodiments, each row can be divided into different memory pages, either physically (for example, for each row, a memory page comprising the odd-order memory cells 210 and a memory page comprising the even-order memory cells 210), or (as herein considered and better discussed below) logically (i.e., wherein each memory cell 210 stores respective portions of different memory pages).

Each memory cell 210 comprises a floating gate transistor (not illustrated). Each bit or group of bits (or symbol, or bit pattern) identifying a respective logical state of the memory cell 210 is physically stored in each memory cell 210 in the form of electric charge in the floating gate, which defines a corresponding threshold voltage of the transistor. The number of bits each memory cell 210 is capable of storing depends on memory cell technology. For example, in "Single-Level Cell" (SLC) technology each memory cell (or SLC memory cell) is capable of storing one symbol comprising one bit (i.e. two logical states, 0 or 1, defining, i.e. being associated with, two threshold voltages), in "Multi-Level Cell" (MLC) technology each memory cell (or MLC memory cell) is capable of storing one symbol comprising more than one bit, typically two bits (i.e. four logical states, 00, 01, 10, or 11, defining, i.e. being associated with, four threshold voltages), whereas in "Tri-Level Cell" technology each memory cell (or TLC memory cell) is capable of storing one symbol comprising three bits (i.e. eight logical states, 000, 001, 010, 011, 100, 101, 110 or 111, defining, i.e. being associated with, eight threshold voltages). In the following, explicit reference will be made to SSD devices having MLC or TLC memory cells (referred to as MLC and TLC SSD devices, respectively), which the present invention is mainly intended to.

While, ideally, all memory cells 210 in the flash memory die 200 should feature same (nominal) threshold voltages for same logical states (or, equivalently, for same symbols), practically each threshold voltage associated with a corresponding logical state (or, equivalently, associated with a corresponding symbol) differs across the memory cells 210 and defines a respective threshold voltage distribution (typically, a Gaussian-type probability distribution), thus resulting in a number of threshold voltage distributions equal to the possible logical states each memory cell 210 can take. This is schematically shown in the top drawing of FIG. 2B for a MLC memory cell and in the top drawing of FIG. 2C for a TCL memory cell.

As discussed in the introductory part of this description, the threshold voltage distributions are (ideally) spaced apart from one another, and a corresponding reference voltage $V_k$ is set between each pair of adjacent threshold voltage distributions for sensing/reading the logical state of the memory cells 210 (k=1, 2, 3 in the example of FIG. 2B and k=1, 2, 3, 4, 5, 6, 7 in the example of FIG. 2C).

In the case of MLC memory cell, during a reading operation, a threshold voltage below the reference voltage $V_1$ represents the bit pattern "11", a threshold voltage between the reference voltages $V_1$ and $V_2$ represents the bit pattern "01", a threshold voltage between the reference voltages $V_2$ and $V_3$ represents the bit pattern "00", and a threshold voltage above the reference voltage $V_3$ represents the bit pattern "10". In the case of TLC memory cell, during a reading operation, a threshold voltage below the reference voltage $V_1$ represents the bit pattern "111", a threshold voltage between the reference voltages $V_1$ and $V_2$ represents the bit pattern "011", a threshold voltage between the reference voltages $V_2$ and $V_3$ represents the bit pattern "001", a threshold voltage between the reference voltages $V_3$ and $V_4$ represents the bit pattern "101", a threshold voltage between the reference voltages $V_4$ and $V_5$ represents the bit pattern "100", a threshold voltage between the reference voltages $V_5$ and $V_6$ represents the bit pattern "000", a threshold voltage between the reference voltages $V_6$ and $V_7$ represents the bit pattern "010", and a threshold voltage above the reference voltage $V_7$ represents the bit pattern "110".

To read a memory cell 210, the threshold voltage of the memory cell 210 is compared to the reference voltages $V_K$. According to an embodiment, reading a memory cell 210 that stores a bit pattern of m bits requires, for at least one page of memory cells (hereinafter, memory page), m such comparisons.

For example, when m=3, such as in the TLC memory cell, the threshold voltage is first compared to the reference voltage $V_4$. Depending on the outcome of that comparison, the threshold voltage is then compared either to the reference voltage $V_2$ or to the reference voltage $V_6$. Depending on the outcome of the second comparison, the threshold voltage is then compared either to the reference voltages $V_1$ or $V_3$ or to the reference voltages $V_5$ or $V_7$.

The two bits stored in a MLC memory cell are usually referred to as "Least Significant Bit" (LSB bit) and "Most Significant Bit" (MSB bit)—with reference to the conceptual representation of vertically arranged symbol associated with the respective threshold voltage distribution, the LSB and MSB bits are assumed to be the bottom and top bits, respectively—whereas the three bits stored in a TLC memory cell are usually referred to as "Least Significant Bit" (LSB bit), "Center Significant Bit" (CSB bit) and "Most Significant Bit" (MSB bit)—with reference to the conceptual representation of vertically arranged symbol associated with the respective threshold voltage distribution, the LSB, CSB and MSB bits are assumed to be the bottom, central and top bits, respectively. The terms LSB, CSB and MSB are used only as a reference to specific bits within the memory cell, and do not imply that certain bits are more important than others (in this respect, any other suitable terminology can also be used).

According to a typical implementation herein assumed, different bits in a given group of memory cells 210 correspond to different memory pages.

For example, a group of eight-logical states (TLC) memory cells 210 can be used for storing three memory pages, a first page in the LSB bits of the memory cells of the group (thus referred to as LSB page), a second page in the CSB bits of the memory cells of the group (thus referred to as CSB page), and a third page in the MSB bits of the memory cells of the group (thus referred to as MSB page). Similarly, a group of four-logical states (MLC) memory cells can be used for storing LSB and MSB pages.

Back to FIG. 2A, the memory die 200 preferably comprises peripheral circuits (such as decoders, multiplexers, drivers, buffers, sense amplifiers), which, being not relevant for the present description, are represented in the figure by means of a single functional block (denoted by the number reference 215). Such peripheral circuits 215 are configured, in general, for accessing selected (pages of) memory cells (as conceptually represented in the figure by arrow connection between the peripheral circuits 215 and the memory array 205) and for running selected operations thereon (e.g. write, read, diagnosis operations).

The increasing of the number of bits per memory cell causes, for a same threshold voltage distribution space (i.e., for the same allowed maximum and minimum threshold voltages), a higher number of threshold voltage distributions. A higher number of threshold voltage distributions in the same threshold voltage distribution space results in threshold voltage distributions that are closer to each other. This makes the memory cells more prone to suffer severe cell-to-cell interference, mainly arising from floating gate coupling effect between a target memory cell (i.e., a memory cell to be read or written) and the surrounding memory cells, and retention noise, i.e. a loss of the capability of the memory cells to retain the stored bits over time caused by progressive damage of the oxide layer (due to the high electrical fields applied at each program/erase operation) that determines an undesired flow of electrons away/in the floating gate.

Cell-to-cell interference and retention noise translate into partially overlapping areas of adjacent threshold voltage distributions (shown in the bottom drawings of FIGS. 2B and 2C) and, hence, into increasing of the number of bit errors per unit time (referred to as "Raw Bit Error Rate" or RBER).

With reference now to FIG. 3A, it schematically shows, in terms of operating units, a simplified architecture of a SSD controller 305 according an embodiment the present invention. For the sake of completeness, such a figure also shows, in a smaller size, the memory chips $110_i$ and the channels $115_j$ (equivalent to those illustrated in the previous figures), which identify, together with the SSD controller 305, a SSD device 300. Similarly to the above, the term "unit" is herein intended to emphasize functional (rather than implementation) aspects thereof. Indeed, without losing of generality, each unit of the SSD controller 305 may be physically implemented by software, hardware, and/or a combination thereof, and/or within any pre-existing or dedicated entity. In this respect, the operating units are also intended to represent corresponding method steps of a method according to the present invention.

As visible in the figure, the SSD controller 305 comprises, similarly to the SSD controller 105, a SSD interface 320, a SSD control unit 325, a memory interface unit 335, and a memory unit 340, which will not be discussed again for the sake of conciseness.

The SSD controller 305 also comprises an encoding unit 345 for encoding the bits to be stored in the memory array 205 (i.e., the information bits) by means of an ECC code. According to an embodiment of the present invention, the encoding unit 345, and the respective decoding unit (discussed in the following), are implemented in the FEC unit 130.

Preferably, the ECC code is an ECC code allowing soft decoding—or, otherwise stated, an ECC code that allows determining each bit value (hard decoding) as well as each bit reliability in terms of soft bits. More preferably, the ECC code is a "Low-Density Parity-Check" (LDPC) code—hence, the encoding unit 345 will be referred to as LDPC encoding unit 345 and the corresponding encoded bits will be referred to as LDPC encoded bits.

LDPC code is a linear ECC code (constructed by using a sparse bipartite graph) that allows transmitting data over a noisy channel. LDPC code is a capacity-approaching code, which means that practical constructions exist that allow the noise threshold to be set very close to the theoretical maximum (the Shannon limit given by the Shannon theorem) for a symmetric memory-less channel.

The Shannon theorem specifies the maximum rate at which data can be transmitted over a channel of a specified bandwidth in the presence of noise. More specifically, according to the Shannon theorem, a bound on the maximum amount of error-free data that can be transmitted with a specified bandwidth in the presence of the noise interference is set, assuming that the signal power is bounded, and that the Gaussian noise process is characterized by a known power or power spectral density. The noise threshold defines an upper bound for the channel noise, up to which the probability of data errors can be made as small as desired.

Thanks to soft decoding allowed by LDPC code, for a given code rate (i.e., the ratio between the information bits to the (LDPC, in the case at issue) encoding unit and the total number of bits generated by the encoding unit, the total number of bits generated by the encoding unit including the parity bits), LDPC code approaches the Shannon limit more than ECC codes typically used in prior art solutions (such as BCH codes), which translates into area saving while maximizing the probability of accurately recovering the bits after a reading operation.

This is illustrated in FIG. 3B, which shows a diagram of "Raw Bit Error Rate" capability, with respect to code rate, of LDPC code and of different BCH codes. In the figure it is also plotted the Shannon limit.

As visible in the figure, given a code rate of 0.9, LDPC code approaches the Shannon limit more than BCH code, whereas the same RBER can be achieved by means of the BCH code only with a code rate of 0.75 (which implies a 25% area overhead).

According to an embodiment, LDPC is a variable rate LDPC code, so that it may change the code rate depending on the RBER. Advantageously, the variable rate LDPC code is a "Quasi-Cyclic Low Density Parity Check" (QC LDPC) code. Broadly speaking, a QC LDPC code has a parity check matrix that is composed of circulant matrices of the same size. Each circulant matrix is a square matrix wherein each row is one degree of right-cyclic shift of the row above it (so that the first row is also the right-cyclic shift of the last row), and wherein each column is one degree of downward-cyclic shift of the column on the left (so that the first column is also the downward-cyclic shift of the rightmost column).

Thus, by enabling different rows/columns of the circulant matrices, the number of parity bits within the circulant matrices may be kept the same while changing the number of information bits within the circulant matrices, thus implying code rate changing. Alternatively, by splitting the rows and introducing a number of all zero circulant matrices, the number of parity bits within the circulant matrices may be changed, so that the parity check matrix becomes more sparse (and the number of parity bits and information bits, and hence the code rate, is changed).

Back to FIG. 3A, the SSD controller 305 also comprises a mapping unit 350 for mapping the LPDC encoded bits into mapped LDPC encoded bits (the mapped LDPC encoded bits representing the symbols to be stored in a selected group of memory cells, or target memory cells. Similarly to the above, symbols storing takes place by means of the memory interface unit 335 that transmits the mapped LDPC encoded bits to the memory chips $110_i$ (and, hence, to the target memory cells), and thanks to control unit 325 action that controls addressing of the memory chips $110_i$.

Roughly speaking, the mapping operation provides a proper association of each symbol with a respective memory cell of the target memory cells. According to the present invention, said proper association of the symbols with the target memory cells is such that the threshold voltage distributions associated with those symbols define (once written in the target memory cells) overlapping regions smaller than a predetermined overlapping region indicative of an admitted RBER—indeed, as discussed above, the higher the overlapping regions between adjacent threshold voltage distributions, the higher the uncertainty of the read (and, hence, the higher the UBER).

Preferably, as also conceptually illustrated by arrow connections between the SSD control unit 325, the encoding unit 345, the mapping unit 350 and the memory interface unit 335, the mapping unit 350 (and, hence, the mapping operation performed by it) can be selectively enabled by the control unit 325, and hence the LDPC encoded bits may be fed directly to the memory interface unit 335 when the mapping unit 350 is disabled. According to an embodiment of the present invention, selective enabling of the mapping unit 350 takes place after a predetermined number of detected failures (e.g., bit errors). Additionally or alternatively, selective enabling of the mapping unit 350 can take place after a predetermined working period of the SSD device 300 from its first use (e.g., after the program/erase cycles stored in the memory unit 340 reaches a predetermined number), e.g. in order to compensate for decreasing performance affecting the SSD device 300 with its use.

Preferably, the LPDC encoded bits are mapped (in the mapping unit 350) according to a criterion of maximization of distance among the threshold voltages distributions (associated with the resulting symbols) over the target memory cells intended to be written (as better discussed below). This allows reducing the number of bit error, and hence the UBER, in the SSD device 300.

The SSD controller 305 further comprises demapping 355 and LDPC decoding 365 units for carrying out demapping and decoding operations to the read bits in order to extract the information bits therefrom (the demapping and LDPC decoding operations being substantially reverse operations with respect to the encoding and mapping operations carried out at LDPC encoding 345 and mapping 350 units, respectively). Since, in order to work properly, the LDPC decoding unit 365 requires, for each read bit, a "Log Likelihood Ratio" (LLR) associated with that bit (indicative of the probability that the read bit is correct), and the demapping unit 355 only outputs soft bits representing metrics indicative of distances among the threshold voltage distributions, hereinafter metric soft bits, a conversion unit 360 is also provided between the demapping unit 355 and the LDPC decoding unit 365 (as illustrated in FIG. 3A) for converting the metric soft bits into LLRs. Provision of the conversion unit 360 allows implementing the demapping unit 355 by means of known architectures (an example thereof being discussed in the following) without that changes or modifications to their operation are required.

With reference also to FIG. 4A, it schematically shows a simplified architecture of the mapping unit 350 according an embodiment of the present invention.

In the considered embodiment, the mapping unit 350 is based on a N-dimensional mapping scheme (for example, a 4-Dimensional, or 4-D, mapping scheme).

According to the N-Dimensional mapping scheme, an arbitrary N-dimensional arbitrary constellation is first partitioned into a number of subsets. The LDPC encoded bits (from the LDPC encoding unit 345) input to the mapping unit 350 in each N-dimensional symbol interval is divided into two portions (or groups) of bits. A first group of bits is input to an N-dimensional k/k+1 convolutional encoding unit 405, which applies to them a convolutional code (i.e., a type of ECC code that convolutionally generates encoded bits (or convolutionally encoded bits), hereinafter parity bits, via the sliding application of a Boolean polynomial function), and whose output parity bits are used to identify an N-dimensional subset of the constellation. The parity bits are used to help mapping whose purpose is to write potentially interfering symbols over the memory cells as far as possible from each other. A second group of bits of the LDPC encoded bits remains instead (convolutionally) uncoded and is used to further specify an N-dimensional symbol from the identified N-dimensional subset. The first and second groups of bits are supplied to an N-dimensional "Maximum Distance Voltage Mapping" unit 410 (hereinafter, MDVM unit), which converts them into an N-dimensional symbol or J P-dimensional points, where J and P are integers whose product equals N.

In the example at issue, for each set of 8 LDPC encoded bits (to be stored in four memory cells 210), the convolutional code is applied only to the first 2 LDPC encoded bits of that set, and the corresponding parity bits are fed to the MDVM unit 410, whereas the remaining 6 LDPC encoded bits are fed to the MDVM unit 410 directly (and used to generate a subset composed by $2^6$ points).

According to an embodiment, the N-dimensional k/k+1 convolutional encoding unit 405 is a 2/3 convolutional encoding unit (the three parity bits being used to select the subset out of $2^3$ subsets), which introduces a redundancy in terms of parity bits.

In order to separate as much as possible the symbols and to avoid writing this redundancy, five symbols are required—as conceptually shown in FIG. 4A at the output of the MDVM unit 410, wherein four symbols each one of three bits (instead of two bits) are provided (to be written in a group of, e.g. four, memory cells 210).

In the example at issue of 4-D mapping scheme and of 9 bits input to the MDVM unit 410, the MDVM unit 410 maps $2^9$ points into a 4-D constellation.

In order to achieve that, as shown in FIG. 4B, each 2-Dimensional (2-D) constellation (corresponding to each one of the memory cells 210, referred to as Cell 1, Cell 2, Cell 3 and Cell 4 in the figure) is partitioned in two subsets, denoted by E and F, then each 2-Dimensional (2-D) constellation is partitioned in four subsets, namely A=(E,E), B=(F,F), C=(E,F), and D=(F,E).

Finally, the 4-D constellation is partitioned in eight 4-D subsets, each one containing 64 4-D points, as shown in the table below.

Since each dimension has 5 levels (i.e., symbols), the 4-D constellation contains $5^4$ points, from which $2^9$ points for mapping are chosen. Preferably, as also shown in FIG. 4B, in each 2-D constellation only 24 of the total 25 points are considered. More preferably, this is achieved by discarding the central point, which means that no input is mapped to the central point.

4-D mapping is constructed hierarchically by taking two 2-D mapping. Each 4-D subset is the union of two 4-D types, and each 4-D type is constructed by two 2-D subsets. For example, in both 2-D constellations, the subsets A both have 6 points, so the 4-D type (A, A) have 36 points. Similarly, 2-D subsets B both have 6 points, so the 4-D type (B,B) have 36 points. 32 points from the 4-D type (A,A) and 32 points from the 4-D type (B,B) are taken to form the 4-D subset $P_1$ which contains 64 points. The construction of each 4-D subset is illustrated in the following table. Under each 4-D type is a pair of numbers. The first number denotes how many 4-D points are in this 4-D type, while the second number denotes how many points are considered from this 4-D type for mapping.

| 4-D subset | Concatenation form |
|---|---|
| $P_1$ | (A, A) ∪ (B, B) |
|  | (36→32) ∪ (36→32) |
| $P_2$ | (C, C) ∪ (D, D) |
|  | (32→32) ∪ (32→32) |
| $P_3$ | (A, B) ∪ (B, A) |
|  | (36→32) ∪ (36→32) |
| $P_4$ | (C, D) ∪ (D, C) |
|  | (64→64) ∪ (16→0) |
| $P_5$ | (A, C) ∪ (B, D) |
|  | (24→16) ∪ (48→48) |
| $P_6$ | (C, B) ∪ (D, A) |
|  | (48→48) ∪ (24→16) |
| $P_7$ | (A, D) ∪ (B, C) |
|  | (48→48) ∪ (24→16) |
| $P_8$ | (C, A) ∪ (D, B) |
|  | (48→48) ∪ (24→16) |

As mentioned above, in order to separate as much as possible the symbols and to avoid writing this redundancy, five symbols are required. As a result of that, five different threshold voltages are required in the SSD device 300. In order to achieve that:

a new threshold voltage (and, hence, a new threshold voltage distribution) is introduced in a (2-bits) MLC flash memory device, provided that the MLC flash memory device manufacturer allows that. In other words, in a (2-bits) MLC flash memory device the required five symbols (resulting from the above mapping operations) represent, actually, the allowed symbols that are allowed to be written in the four target memory cells. In this case, the number of allowed symbols is higher than the number of the possible symbols the memory cell is designed to store, however the fact that four (allowed) symbols (among five possible symbols) are to be written in four memory cells (or, otherwise stated, the fact that the symbols to be stored are a subset of the allowed symbols) allows introducing a certain (minimum) distance among the threshold voltage distributions (advantageously, especially among the threshold voltage distributions that are more critical from overlapping standpoint). Thus, by virtue of the UBER improvement that combined action of LPDC encoding/decoding and mapping/demapping allow achieving, any consumer MLC SSD device (supporting five threshold voltages) may be made comparable, in terms of performance, to an enterprise MLC SSD device, while keeping the low costs of the consumer MLC SSD device; or only five threshold voltages among the eight threshold voltages (and, hence, only five threshold voltages distributions among the eight threshold voltages distributions) of a TLC SSD device are used (i.e., the TLC SSD device is dealt as a MLC SSD device). In other words, in a TLC flash memory device the required five symbols (resulting from the above mapping operations) represent, actually, the allowed symbols, among the eight possible symbols, that are allowed to be written in the four target memory cells. The fact that the number of allowed symbols is lower than the number of possible symbols equals to say that, in order to comply with the above-discussed criterion of maximization of distance, a number of forbidden symbols (i.e., logical states or bit patterns) are set for the target memory cells (the forbidden symbols being not allowed to be written in the target memory cells). The fact that the number of allowed symbols is lower than the number of the possible symbols the memory cell is designed to store (the symbols to be stored being still a subset of the allowed symbols, as in the MLC memory cell case), which translates into the presence of the forbidden symbols, can allow introducing a high distance among the threshold voltage distributions, depending on the pattern of the allowed and forbidden symbols. According to an embodiment, in the scenario herein considered wherein the possible symbols define a succession of possible symbols (with adjacent possible symbols of the succession that differ from each other for one bit), the pattern of the allowed and forbidden symbols may be defined such that at least one allowed symbol of the plurality of allowed symbols is adjacent to a respective forbidden symbol. In the example herein considered of TLC memory cell, each forbidden symbol may be set adjacent to at least one allowed symbol of said five allowed bit symbols in order to comply with said criterion of maximization of distance. Thus, by virtue of the UBER improvement that combined action of LPDC encoding/decoding and mapping/demapping allow achieving, any consumer TLC flash memory device may be made comparable, in terms of performance, to an enterprise MLC SSD device, while keeping the low costs of the consumer TLC SSD device.

With reference now to FIG. 4C, a demapping unit 355 according to an embodiment of the present invention is schematically shown.

The demapping unit 355 comprises a Maximum Distance Voltage Demapping unit 415 (hereinafter, MDVD unit) performing reverse operations with respect to the MDVM unit 410, and a "Soft Output Viterbi Algorithm" (SOVA) unit 420. SOVA algorithm differs from the conventional Viterbi algorithm in that it takes into account the a priori probabilities of the input symbols, and produces a soft output indicating the reliability of the decision.

Thanks to the MDVD unit 415 and the SOVA unit 420, four memory cells are read and the LLRs (obtained from the metric soft bits in the conversion unit 360 as discussed below) are fed to the LDPC decoding unit 365. Thus, according to the present invention the soft bits do not derive, as instead is in the known solutions discussed in connection with FIGS. 2B and 2C, from multiple reading operations (by moving the reference voltages), which makes LDPC decoding dependent by only a limited number (five, in the considered example) of (hard) threshold voltages, and hence simpler.

The metrics represented by the metric soft bits is not limiting for the present invention. According to an embodiment of the present invention, the metrics are voltage levels indicative of the distances among the threshold voltage distributions associated with the read symbols. By way of example only, in the case of a first threshold voltage at −1V and a second threshold voltage at 1V, and a read threshold voltage at 0.5V, the metrics for the first and second threshold voltages could be 1.5V and 0.5V, respectively. In the considered embodiment, the LLRs could be determined in the conversion unit 360 as the logarithmic ratio between the metrics (thereafter, the computed LLRs are input to the LDPC decoding unit 365). In the case of multiple (i.e., more than two) threshold voltages, and hence of resulting multiple metrics, the LLRs could be determined in the conversion unit 360 as the logarithmic ratio between the relevant metrics (for example, the closest metrics).

The present invention, even applied to consumer (MLC or TLC) flash memory devices, allows obtaining UBER of the order of $10^{-16}$ or less, which is comparable to performance that is expected in enterprise applications. This translates into high reliability and lifetime of the SSD device in terms of sustainable program/erase cycles, as well as in a significant cost reduction for SSD devices for enterprise applications. Moreover, thanks to the present invention it is possible to respond to shortage that typically affect enterprise SSD devices supply chains, as consumer flash memory devices, whose availability is always high, can be used with same performance as enterprise flash memory devices.

Furthermore, as LDPC decoding does not require the above discussed multiple reading operations, improved read access times are obtained.

Back to FIG. 3A, the mapping and demapping units according to another embodiment of the present invention (denoted by the number references 350' and 355' for distinguishing them from the mapping 350 and demapping 355 units based on 4-D mapping) are based on memory page spreading and memory page de-spreading, respectively. For consistency, the corresponding SSD device is denoted by the number reference 300'.

Broadly speaking, according to memory page spreading principles, the availability of the memory pages of the SSD device 300' into which the bits are intended to be written is dynamically updated, e.g. progressively partly reduced, according to the detected bit errors. As will be better understood from the following description, progressive partial reduction of the available memory pages intrinsically allows threshold voltage distributions spacing (so that the overlapping regions are reduced as much as possible thereby ensuring excellent performance in terms of UBER over time), and, in addition to that, avoids that whole memory blocks are declared as totally unavailable (as instead is presently provided by the known solutions), which lengthens the lifetime of the SSD device 300'. Thus, memory page spreading is based on lengthening the lifetime of the SSD device 300' for the same (or even higher, as discussed below) error correction capabilities (whereas, on the other side, the mapping principles above discussed are aimed at improving error correction capabilities of the SSD device 300).

As mentioned above, reference is made to the scenario wherein each symbol stored in a memory cell (among the possible symbols the memory cell is designed to store) comprises bits associated with different memory pages (with the memory cells that are programmed and read simultaneously at memory page level). Broadly speaking, when the RBER of a memory page overruns the admitted RBER, the (spreading-based) mapping unit 350' is configured for:

marking that memory page as a failed memory page and the associated bit as a failed bit, and for the memory cells associated with the failed memory page, determining a plurality of allowed symbols that are allowed to be written in those memory cells. Similarly to the above, the allowed symbols are a subset of the possible symbols so that at least one forbidden symbol is defined (among the possible symbols). Moreover, the allowed symbols are selected according to the above criterion of maximization of distance among the respective threshold voltage distributions and such as to include all possible bit combinations of the bits of the unfailed memory pages (i.e., the memory pages not marked as failed memory pages), or unfailed bits.

In order to conceptually showing this concept, reference will be made from now on to FIG. 5A-5D.

Figures 5A, 5B:
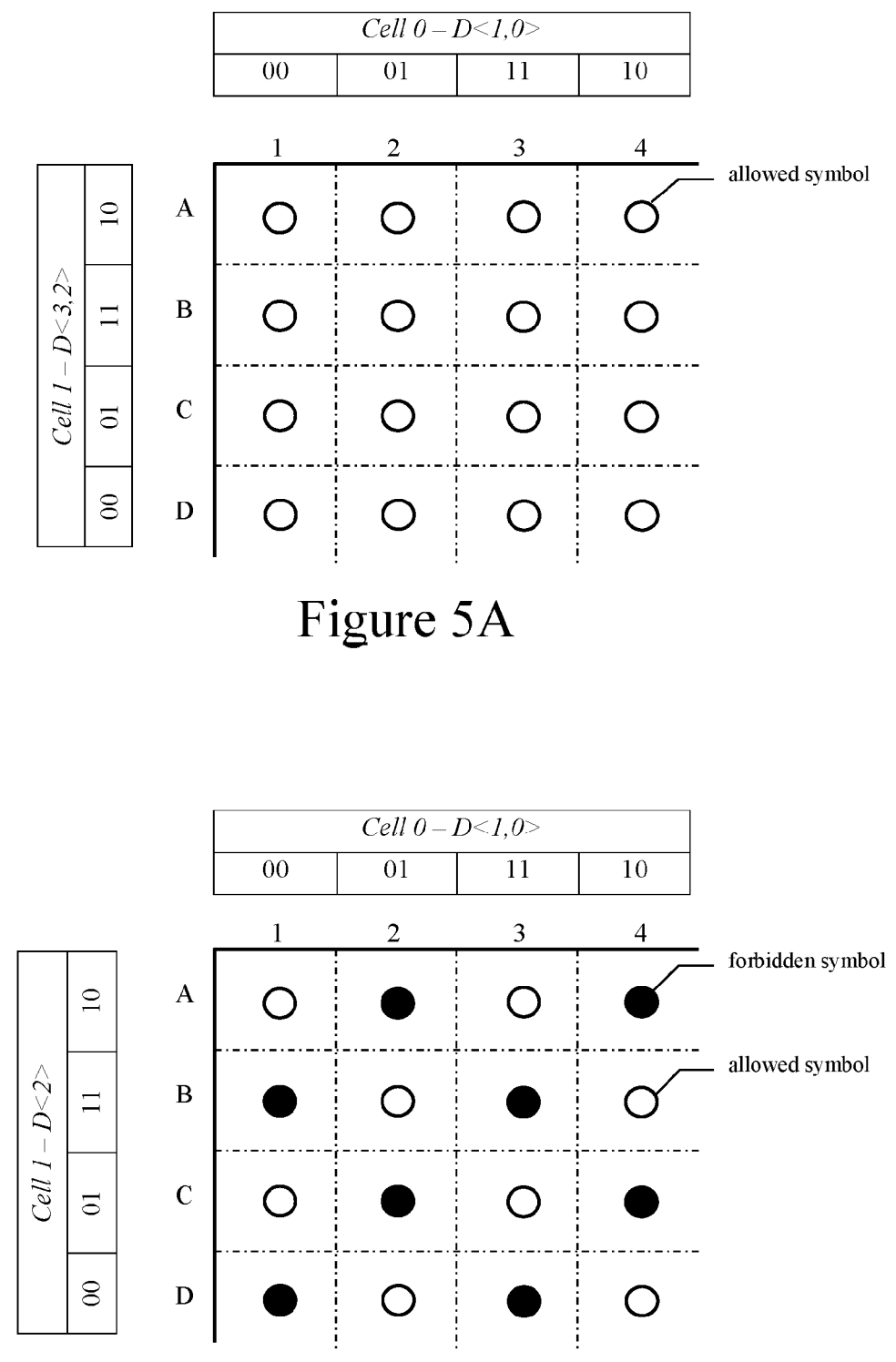

Let be assumed the simplified scenario, illustrated in FIG. 5A, of two MLC memory cells (denoted in the figures by Cell 0 and Cell 1) each one storing two bits of two different memory pages, i.e. the memory pages 0 and 1, denoted by D<1,0> in the figure, whose bits are stored in the memory cell Cell 0 (for example, in the LSB and MSB bits thereof, respectively) as well as in the other memory cells (not shown) of the group of memory cells associated with the memory pages 0 and 1, and the memory pages 2 and 3, denoted by D<2,3> in the figure, whose bits are stored in the memory cell Cell 1 (for example, in the LSB and MSB bits, thereof, respectively) as well as in the other memory cells (not shown) of the group of memory cells associated with the memory pages 2 and 3.

When the RBER overruns an admitted RBER (or, otherwise stated, the RBER overruns the (fixed) error correction capability of the LDPC decoding unit 365), the memory page wherein bit errors (or most of bit errors) have occurred is marked as a failed memory page, and will be no longer considered in the subsequent program/erase cycles—however, other conditions for marking one or more memory page as failed memory pages may be envisaged, according to specific design needs: by way of example only, when a running time of the LDPC decoding unit 365 is above a predefined running time threshold indicative of an excessive computational effort, and/or after a predetermined first number of program/erase cycles have occurred.

This is shown in FIG. 5B, wherein the memory page 3 (stored in the MSB bits of a group of memory cells including the memory cell Cell 1), which has been assumed to be affected by most of bit errors, has been marked as a failed memory page and is no longer available for subsequent program/erase cycles. Otherwise stated, the group of memory cells associated with the failed memory page (the memory page 3 in the example at issue) are considered available to program/erase cycles only for the other (or non-failed) memory page (the memory page 2 in the example at issue), i.e. for the group of memory cells associated with the failed memory page only the bits carrying the information of the non-failed memory page (i.e. the unfailed bits, the LSB bits in the example at issue) will considered valid information.

In the example herein considered of MLC memory cells, this equals to say that the group of MLC memory cells associated with the failed memory page are dealt as SLC memory cells, as only the LSB bits are considered as valid information. However, practically, the MLC memory cells are still MLC memory cells by the program/erase standpoint, i.e. they are erased as conventional MLC memory cells, but in the program and read phase only the LSB bits (or the MSB bits, depending on the failed memory page) are considered.

Therefore, as visible in FIG. 5B, 3 bits (instead of the 4 bits) are stored in 2 MLC memory cells—i.e., 2 bits in the memory cell Cell 0 (one bit for the memory page 0 and the other bit for the memory page 1) and only one bit in the memory cell Cell 1 (this bit being the unfailed bit associated with the non-failed memory page—i.e. the memory page 2 in the example at issue). This equals to introduce, in the constellation of symbols (logical states) that can be theoretically taken by the memory cells Cell 0 and Cell 1 (and, hence, by the other memory cells of the respective groups), forbidden symbols (the symbols 1B, 1D, 2A, 2C, 3B, 3D, 4A, 4C in the example at issue), which are graphically identified by solid circles in the figure (the empty circles instead denoting the allowed symbols).

Furthermore, as visible in the figure, the allowed and forbidden symbols pattern is such that:

the allowed symbols include all possible bit combinations of the unfailed bits. For example, when the memory cell Cell 0 has to store the symbol 00, the allowed symbols for the memory cell Cell 1 are such that the respective bits that will be read as unfailed bits (the LSB bits in the example at issue) contain, for a symbol, 0 and, for the other one, 1, so that all the possible combinations of bits that the (SLC) memory cell Cell 1 is able to store can be stored. In the example at issue, the allowed symbols for the memory cell Cell 1 are 10 and 01, although this should not be construed limitatively.

the distance between the allowed symbols is sufficiently high to avoid, or at least substantially reduce, the overlapping regions among the respective threshold voltage distributions (for example, according to said criterion of maximization of distance). As visibly detectable by the graphic representation of FIG. 5B, in the considered example the distance between the allowed symbols is double with respect to the scenario illustrated in FIG. 5A, which translates in a reduced extent of the overlapping regions of the respective threshold voltage distributions—and, hence, in a lower expected RBER.

Provision of forbidden symbols causes a reduction of the storage capability of the SSD device 300' (which is however a lower reduction with respect to the conventional case wherein the whole memory block to which the memory page belongs is marked as failed) but at the benefit of improved RBER and increased SSD device 300' lifetime.

If the RBER overruns the error correction capability of the LDPC decoding unit 365 again (or, as discussed above, after a predetermined second number of program/erase cycles higher than said predetermined first number of program/erase cycles), the memory page, among the non-failed memory pages, wherein bit errors (or most of bit errors) have occurred is marked as a failed memory page, and will be no longer considered in the subsequent program/erase cycles.

Figure 5C:
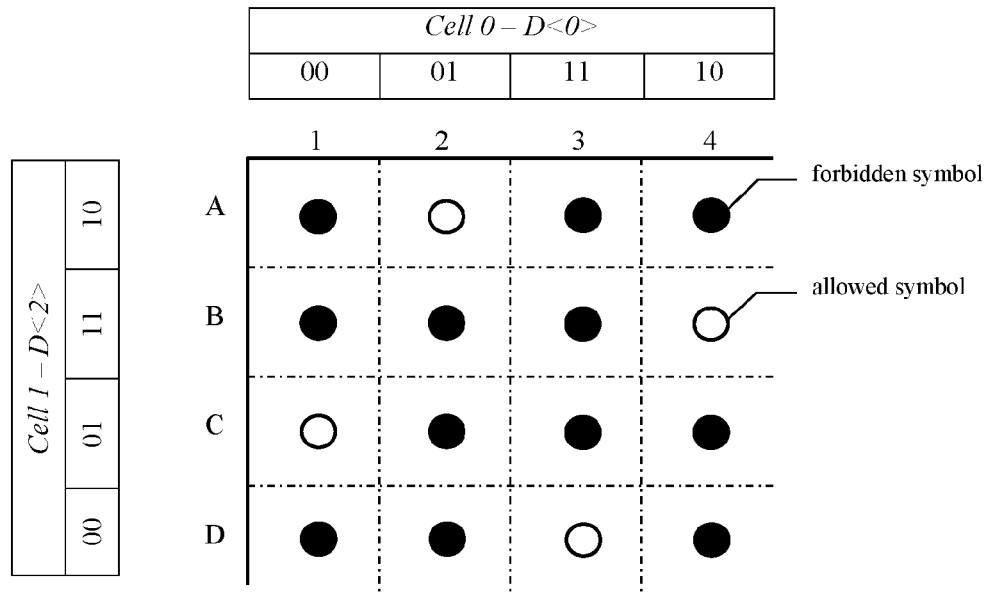

This is shown in FIG. 5C, wherein the memory page 1 (stored in the LSB bits of the group of memory cells including the memory cell Cell 0), which has been assumed to be affected by most of bit errors, has been marked as a failed memory page. Thus, similarly to the above, the group of memory cells associated with the failed memory page (the memory page 1 in the example at issue) are considered available to program/erase cycles only for the respective non-failed memory page (the memory page 0 in the example at issue).

In other words, in the example herein considered of MLC memory cells, the group of memory cells which the memory cell Cell 0 belongs to (as being associated with the failed memory page 1) are dealt as SLC memory cells. Therefore, as visible in FIG. 5C, 2 bits (instead of the 3 bits of the previous case and of the 4 bits of the case even before) are stored in 2 MLC memory cells—i.e., 1 bit in the memory cell Cell 0 (this bit relating to the non-failed memory page 0) and 1 bit in the memory cell Cell 1 (this bit relating to the non-failed memory page 2). This equals to introduce, in the constellation of symbols that can be theoretically taken by the memory cells Cell 0 and Cell 1 (and, hence, by the other memory cells of the respective groups), further forbidden symbols with respect to the previous case (in the depicted example, the forbidden symbols are 1A, 1B, 1D, 2B, 2C, 2D, 3A, 3B, 3C, 4A, 4C, 4D).

As discussed above, while adding forbidden symbols care should be taken in maximizing distance among the threshold voltage distributions (so as to avoid, or at least reduce as much as possible, the overlapping regions). Indeed, as visibly detectable by the graphic representation of FIG. 5C, the allowed and forbidden symbols pattern is different from that of the previous case, and it is not a mere reduction of the allowed symbols. In fact, only marking as forbidden the symbols 2B, 2D, 4B and 4D (in addition to the forbidden symbols of the previous case) would not result in the highest maximization of distance. In the case illustrated in FIG. 5C, instead, the distance between the allowed symbols is triple with respect to the scenario illustrated in FIG. 5A, which translates in a reduced extent of the overlapping regions of the respective threshold voltage distributions—and, hence, in a lower expected RBER. As mentioned above, this further reduces the storage capability of the SSD device 300', but at the benefit of improved RBER and increased SSD device 300' lifetime.

Finally, if the RBER overruns the error correction capability of the LDPC decoding unit 365 again (or, as discussed above, after a predetermined third number of program/erase cycles higher than said predetermined first and second numbers of program/erase cycles), the memory page, among the non-failed memory pages, wherein bit errors (or most of bit errors) have occurred is marked as a failed memory page, and will be no longer considered in the subsequent program/erase cycles.

Figure 5D:
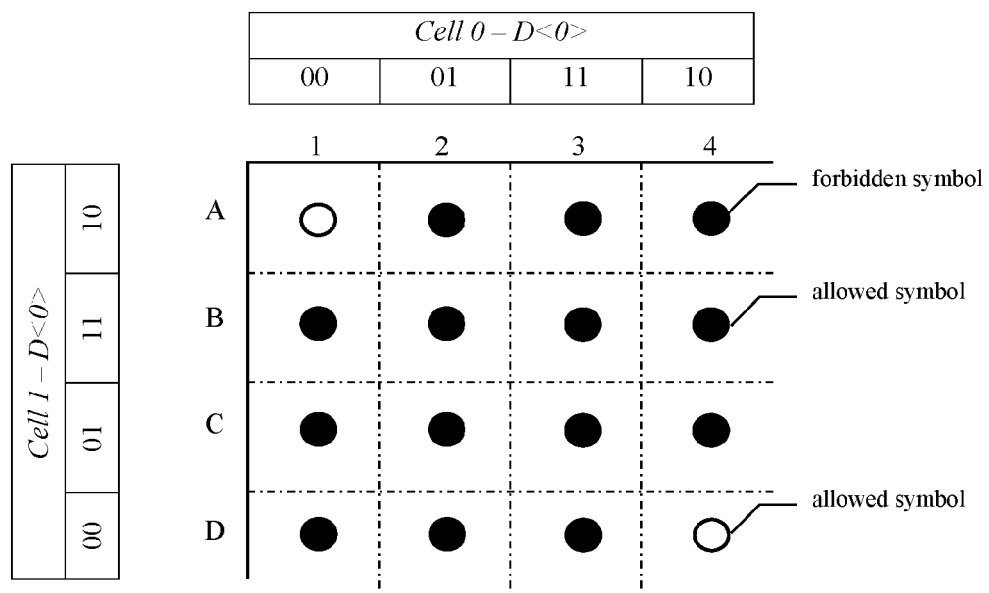

This is shown in FIG. 5D, wherein the memory page 2 (stored in the LSB bits of the group of memory cells including the memory cell Cell 1), which has been assumed to be affected by most of bit errors, has been marked as a failed memory page. However, as both memory pages 2 and 3 are failed memory pages, the group of memory cells which the memory cell Cell 1 belongs to may be dealt as SLC memory cells for the memory page 0 (instead of being totally unused).

In this way, as visible in FIG. 5D, 1 bit is stored in 2 MLC memory cells—i.e., 1 bit in the memory cell Cell 0 (this bit relating to the non-failed memory page 0) and 1 bit in the memory cell Cell 1 (this bit relating to the same non-failed memory page 0). This equals to introduce, in the constellation of symbols that can be theoretically taken by the memory cells Cell 0 and Cell 1 (and, hence, by the other memory cells of the respective groups), further forbidden symbols with respect to the previous case. Similarly to the above, a distance maximization criterion between the threshold voltage distributions is preferably considered, which leads to the illustrated allowed and forbidden symbols pattern. In fact, in the case illustrated in FIG. 5D, the only allowed symbols are 1A and 4D, which translates in a distance among the allowed symbols that is quadrupled with respect to the scenario illustrated in FIG. 5A, and in a further reduced extent of the overlapping regions of the respective threshold voltage distributions—and, hence, in a lower expected RBER. Similarly to the above, this is at the expense of the storage capability of the SSD device 300', but at the benefit of improved RBER and increased SSD device 300' lifetime.

Thanks to the memory page spreading (and de-spreading) implemented in the mapping unit 350' (and in the de-mapping unit 355'), the lifetime of the SSD device 300' is increased for the same, or even higher, error correction capabilities. Indeed, when applying memory page spreading and de-spreading to consumer (SLC, MLC or TLC) SSD devices, UBER of the order of $10^{-16}$ or less are obtained (by virtue of threshold voltage distribution spacing arising from progressive partial reduction of the memory pages), which is comparable to performance that is expected in enterprise applications. This translates into high reliability and lifetime of the SSD device 300' in terms of sustainable program/erase cycles, as well as in a significant cost reduction for SSD devices for enterprise applications. Moreover, also in this case it is possible to respond to shortage that typically affect enterprise SSD devices supply chains, as consumer SSD devices, whose availability is always high, may be used with same performance as enterprise SSD devices.

Although explicit reference to encoding and decoding units based on LDPC code has been made, nothing prevents from using, at least for this embodiment, encoding and decoding units based on different ECC codes (such as BCH code and Turbo code).

In addition, although this embodiment has been discussed in connection with the SSD controller 305 architecture, this should not be construed limitatively. For example, according to an embodiment of the present invention, memory page de-spreading may also be practiced without the conversion unit 360, e.g. when no metrics (to be converted into LLRs) are output from the de-mapping unit 355' and/or when no LLRs are required by the decoding unit 365.

Naturally, in order to satisfy local and specific requirements, a person skilled in the art may apply to the present invention as described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, different embodiments of the invention may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the invention may be incorporated in any other embodiment.

What is claimed is:

1. A controller for a solid state drive, the solid state drive comprising a plurality of memory cells, wherein each memory cell comprises a floating gate transistor and each memory cell is adapted to store a symbol when the floating gate transistor is programmed with a threshold voltage associated with that symbol, and wherein each threshold voltage associated with a corresponding symbol is variable over the memory cells of the plurality of memory cells thereby defining a corresponding threshold voltage distribution, the controller comprising:

an encoding unit for encoding information bits into encoded bits;

a mapping unit for mapping the encoded bits into symbols to be stored, each symbol to be stored being intended to be stored into a respective target memory cell, said mapping unit mapping the encoded bits by associating the symbols to be stored with the target memory cells in such a way that the threshold voltage distributions associated with said symbols to be stored define overlapping regions smaller than a predetermined overlapping region indicative of a bit error rate admitted for the memory cells;

a demapping unit for demapping read symbols read from the target memory cells and providing metrics indicative of a distance between the threshold voltage distributions associated with said read symbols, a conversion unit for converting said metrics into an indication of the reliability of the read symbols, and a soft decoding unit for soft decoding the read symbols according to said indication of the reliability of the read symbols thereby obtaining said information bits.

2. The controller according to claim 1, wherein said mapping unit further maps the encoded bits by associating the symbols to be stored with the target memory cells according to a criterion of maximization of distance among the threshold voltage distributions associated with said symbols to be stored.

3. The controller according to claim 1, wherein said mapping unit further maps the encoded bits by determining a plurality of allowed symbols that are allowed to be written in the target memory cells according to a criterion of maximization of distance among the threshold voltage distributions associated therewith, said symbols to be stored being a subset of said plurality of allowed symbols.

4. The controller according to claim 1, wherein each memory cell can store a symbol among a plurality of possible symbols that the memory cell is designed to store, and wherein said mapping comprises determining a plurality of allowed symbols that are allowed to be written in the target memory cells according to a criterion of maximization of distance among the threshold voltage distributions associated therewith, said plurality of allowed symbols being a subset of said plurality of allowed symbols so that at least one forbidden symbol that is not allowed to be written in the target memory cells is defined among the plurality of possible symbols, and said symbols to be stored being a subset of said plurality of allowed symbols.

5. The controller according to claim 4, wherein the plurality of possible symbols define a succession of possible symbols, adjacent possible symbols of the succession differing from each other for one bit, and wherein at least one allowed symbol of said plurality of allowed bit symbols is adjacent to said at least one forbidden bit symbol.

6. The controller according to claim 4, wherein each bit symbol that each memory cell is designed to store comprises three bits defining a succession of eight possible symbols, and wherein the plurality of allowed symbols comprise five allowed symbols among the eight possible symbols and the at least one forbidden symbol comprises three forbidden symbols each one adjacent to at least one allowed symbol of said five allowed symbols in order to comply with said criterion of maximization of distance.

7. The controller according to claim 1, further comprising a convolutional encoding unit for convolutionally encoding a first portion of the encoded bits into convolutionally encoded bits, said mapping unit further mapping the encoded bits based on a 4-Dimensional mapping scheme applied to said convolutionally encoded bits and to a second portion of the encoded bits not convolutionally encoded.

8. The controller according to claim 1, wherein said demapping unit comprises a "Maximum Distance Voltage Demapping" (MDVD) unit and a "Soft Output Viterbi Algorithm" (SOVA) unit.

9. The controller according to claim 1, wherein said metrics are voltage levels indicative of the distances among the threshold voltage distributions associated with said read symbols.

10. The controller according to claim 1, wherein said indication of the reliability of the read symbols provided by the conversion unit from said metrics comprises, for each read symbol, a logarithmic ratio between the respective metrics.

11. The controller according to claim 1, wherein said encoding unit and said soft decoding unit are configured to respectively perform encoding of the information bits and soft decoding of the read symbols by means of a "Low Density Parity Check" (LDPC) code.

12. The controller according to claim 1, wherein said encoding unit and said soft decoding unit are configured to respectively perform encoding of the information bits and soft decoding of the read symbols by means of a "Quasi-Cyclic Low Density Parity Check" (QC LDPC) code.

13. The controller according to claim 1, wherein the memory cells are programmed and read simultaneously at memory page level, and wherein each memory cell can store a symbol among a plurality of possible symbols that the memory cell is designed to store, wherein each symbol comprises bits associated with different memory pages, and wherein, when a bit error rate of a memory page overruns the bit error rate admitted for the memory cells, said mapping unit maps the encoded bits by:
  marking that memory page as a failed memory page and the associated bit as a failed bit, each memory page other than a failed memory page being associated with an unfailed bit, and
  for the memory cells associated with the failed memory page, determining a plurality of allowed symbols that are allowed to be written in those memory cells, said plurality of allowed symbols being a subset of the plurality of the possible symbols so that at least one forbidden symbol that is not allowed to be written in those memory cells is defined among the plurality of possible symbols, said plurality of allowed symbols being selected according to a criterion of maximization of distance among the threshold voltage distributions associated therewith and such as to include all possible bit combinations of the unfailed bits.

14. A controller for a solid state drive, the solid state drive comprising a plurality of memory cells programmed and read simultaneously at memory page level, wherein each memory cell comprises a floating gate transistor and each memory cell is adapted to store a symbol, among a plurality of possible symbols that the memory cell is designed to store, when the floating gate transistor is programmed with a threshold voltage associated with that symbol, and wherein each threshold voltage associated with a corresponding symbol is variable over the memory cells of the plurality of memory cells thereby defining a corresponding threshold voltage distribution, and wherein each symbol comprises bits associated with different memory pages, the controller comprising:
  an encoding unit for encoding information bits into encoded bits;
  a mapping unit for mapping the encoded bits into symbols to be stored, each symbol to be stored being intended to be stored into a respective target memory cell, when a bit error rate of a memory page overruns an admitted bit error rate, said mapping unit mapping the encoded bits by:
    marking that memory page as a failed memory page and the associated bit as a failed bit, each memory page other than a failed memory page being associated with an unfailed bit, and
    for the memory cells associated with the failed memory page, determining a plurality of allowed symbols that are allowed to be written in those memory cells, said plurality of allowed symbols being a subset of the plurality of the possible symbols so that at least one forbidden symbol that is not allowed to be written in those memory cells is defined among the plurality of possible symbols, said plurality of allowed symbols being selected in such a way that the threshold voltage distributions associated therewith define overlapping regions smaller than a predetermined overlapping region indicative of the admitted bit error rate and such as to include all possible bit combinations of the unfailed bits, said symbols to be stored being a subset of said plurality of allowed symbols;
  a demapping unit for demapping read symbols read from the target memory cells and providing an indication of the reliability of the read symbols, and
  a soft decoding unit for soft decoding the read symbols according to said indication of the reliability of the read symbols thereby obtaining said information bits.

15. A solid state drive comprising:
  a plurality of memory cells, wherein each memory cell comprises a floating gate transistor and each memory cell is adapted to store a symbol when the floating gate transistor is programmed with a threshold voltage associated with that symbol, and wherein each threshold voltage associated with a corresponding symbol is variable over the memory cells of the plurality of memory cells thereby defining a corresponding threshold voltage distribution;
  an encoding unit for encoding information bits into encoded bits;
  a mapping unit for mapping the encoded bits into symbols to be stored, each symbol to be stored being intended to be stored into a respective target memory cell, said mapping comprising associating the symbols to be stored with the target memory cells in such a way that the threshold voltage distributions associated with said symbols to be stored define overlapping regions smaller than a predetermined overlapping region indicative of a bit error rate admitted for the memory cells;

a demapping unit for demapping read symbols read from the target memory cells and providing metrics indicative of a distance between the threshold voltage distributions associated with said read symbols, a conversion unit for converting said metrics into an indication of the reliability of the read symbols, and a soft decoding unit for soft decoding the read symbols according to said indication of the reliability of the read symbols thereby obtaining said information bits.

16. The solid state drive according to claim 15, wherein said mapping unit further maps the encoded bits by associating the symbols to be stored with the target memory cells according to a criterion of maximization of distance among the threshold voltage distributions associated with said symbols to be stored.

17. The solid state drive according to claim 15, wherein said mapping unit further maps the encoded bits by determining a plurality of allowed symbols that are allowed to be written in the target memory cells according to a criterion of maximization of distance among the threshold voltage distributions associated therewith, said symbols to be stored being a subset of said plurality of allowed symbols.

18. The solid state drive according to claim 15, wherein each memory cell can store a symbol among a plurality of possible symbols that the memory cell is designed to store, and wherein said mapping comprises determining a plurality of allowed symbols that are allowed to be written in the target memory cells according to a criterion of maximization of distance among the threshold voltage distributions associated therewith, said plurality of allowed symbols being a subset of said plurality of allowed symbols so that at least one forbidden symbol that is not allowed to be written in the target memory cells is defined among the plurality of possible symbols, and said symbols to be stored being a subset of said plurality of allowed symbols.

19. The solid state drive according to claim 18, wherein the plurality of possible symbols define a succession of possible symbols, adjacent possible symbols of the succession differing from each other for one bit, and wherein at least one allowed symbol of said plurality of allowed symbols is adjacent to said at least one forbidden symbol.

20. The solid state drive according to claim 18, wherein each symbol that each memory cell is designed to store comprises three bits defining a succession of eight possible symbols, and wherein the plurality of allowed symbols comprise five allowed symbols among the eight possible symbols and the at least one forbidden symbol comprises three forbidden symbols each one adjacent to at least one allowed symbol of said five allowed symbols in order to comply with said criterion of maximization of distance.

21. The solid state drive according to claim 15, further comprising a convolutional encoding unit for convolutionally encoding a first portion of the encoded bits into convolutionally encoded bits, said mapping unit further mapping the encoded bits based on a 4-Dimensional mapping scheme applied to said convolutionally encoded bits and to a second portion of the encoded bits not convolutionally encoded.

22. The solid state drive according to claim 15, wherein said demapping unit comprises a "Maximum Distance Voltage Demapping" (MDVD) unit and a "Soft Output Viterbi Algorithm" (SOVA) unit.

23. The solid state drive according to claim 15, wherein said metrics are voltage levels indicative of the distances among the threshold voltage distributions associated with said read symbols.

24. The solid state drive according to claim 15, wherein said indication of the reliability of the read symbols provided by the conversion unit from said metrics comprises, for each read symbol, a logarithmic ratio between the respective metrics.

25. The solid state drive according to claim 15, wherein said encoding unit and said soft decoding unit configured to respectively perform encoding of the information bits and soft decoding of the read symbols by means of are based on a "Low Density Parity Check" (LDPC) code.

26. The solid state drive according to claim 15, wherein said encoding unit and said soft decoding unit are configured to respectively perform encoding of the information bits and soft decoding of the read symbols by means of a "Quasi-Cyclic Low Density Parity Check" (QC LDPC) code.

27. The solid state drive according to claim 15, wherein the memory cells are programmed and read simultaneously at memory page level, and wherein each memory cell can store a symbol among a plurality of possible symbols that the memory cell is designed to store, wherein each symbol comprises bits associated with different memory pages, and wherein, when a bit error rate of a memory page overruns the bit error rate admitted for the memory cells, said mapping unit maps the encoded bits by:

marking that memory page as a failed memory page and the associated bit as a failed bit, each memory page other than a failed memory page being associated with an unfailed bit, and for the memory cells associated with the failed memory page, determining a plurality of allowed symbols that are allowed to be written in those memory cells, said plurality of allowed symbols being a subset of the plurality of the possible symbols so that at least one forbidden symbol that is not allowed to be written in those memory cells is defined among the plurality of possible symbols, said plurality of allowed symbols being selected according to a criterion of maximization of distance among the threshold voltage distributions associated therewith and such as to include all possible bit combinations of the unfailed bits.

28. The solid state drive according to claim 15, wherein said memory cells are non-volatile memory cells.

29. The solid state drive according to claim 15, wherein said memory cells are flash memory cells.

30. The solid state drive according to claim 15, wherein said memory cells are NAND flash memory cells.

* * * * *